United States Patent
Tani

(10) Patent No.: US 7,042,238 B2
(45) Date of Patent: May 9, 2006

(54) SOCKET FOR INSPECTION

(75) Inventor: Yoshihisa Tani, Nagano (JP)

(73) Assignee: NHK Spring Co., Ltd., Kanagawa (JP)

( * ) Notice: Subject to any disclaimer, the term of this patent is extended or adjusted under 35 U.S.C. 154(b) by 0 days.

(21) Appl. No.: 10/471,542

(22) PCT Filed: Dec. 27, 2002

(86) PCT No.: PCT/JP02/13865

§ 371 (c)(1),
(2), (4) Date: Sep. 11, 2003

(87) PCT Pub. No.: WO03/058768

PCT Pub. Date: Jul. 17, 2003

(65) Prior Publication Data

US 2004/0070414 A1 Apr. 15, 2004

(30) Foreign Application Priority Data

Dec. 28, 2001 (JP) ............................. 2001-401432

(51) Int. Cl.
*G01R 31/02* (2006.01)
(52) U.S. Cl. .................................. 324/755
(58) Field of Classification Search ........ 324/754–755, 324/72.5, 158.1, 758, 760; 439/70–71, 73, 439/66, 330–331
See application file for complete search history.

(56) References Cited

U.S. PATENT DOCUMENTS 4,554,505 A * 11/1985 Zachry ........................ 324/755
5,087,878 A * 2/1992 Belmore et al. ............ 324/754

(Continued)

FOREIGN PATENT DOCUMENTS

JP 6-310232 A 11/1994

(Continued)

OTHER PUBLICATIONS

CD-ROM of the specification and drawings annexed to the request of Japanese Utility Model Application No. 68215/1992 (Laid-open No. 33382/1994), Japan Aviation Electronics Industry Ltd., Apr. 28, 1994.

*Primary Examiner*—Jermele Hollington
(74) *Attorney, Agent, or Firm*—Lowe Hauptman & Berner, LLP

(57) ABSTRACT

To apply a constant pressing force to an object to be tested, so that reliable tests can be performed. A test socket 10 presses an object to be tested 1 against the testing face of a testing device 4. The present invention comprises (1) a frame 11 that (a) is detachably mounted onto a base 8 that has an opening 8a for setting the object to be tested 1 therein, with said base mounted on the testing face, and (b) opens or closes said opening 8a, (2) an operating member 12, (a) that has a shaft 16 that is mounted onto the frame 11 in such a manner so as to rotate both forward and reverse within a predetermined angle, and (b) on which engagement parts 18 that protrude towards the object to be tested 1 are formed, and (3) a plate spring 13 that (a) has spring pieces 13b that stand at a specified angle along the rotational direction of said shaft 16 and that slide together with said engagement parts 18, and (b) is mounted onto the shaft 16 in such a way that the plate spring 13 can move to contact with or separate from the object to be tested 1.

9 Claims, 19 Drawing Sheets

U.S. PATENT DOCUMENTS

| | | | | |
|---|---|---|---|---|
| 5,245,277 A | * | 9/1993 | Nguyen | 324/761 |
| 5,572,144 A | * | 11/1996 | Davidson et al. | 324/755 |
| 5,729,147 A | * | 3/1998 | Schaff | 324/755 |
| 5,807,104 A | * | 9/1998 | Ikeya et al. | 324/765 |
| 6,262,581 B1 | * | 7/2001 | Han | 324/755 |
| 6,377,061 B1 | * | 4/2002 | Settle et al. | 324/755 |
| 6,448,803 B1 | * | 9/2002 | Chung | 324/765 |

FOREIGN PATENT DOCUMENTS

| | | | |
|---|---|---|---|
| JP | 8-306455 A | | 11/1996 |
| JP | 10106706 A | * | 4/1998 |
| JP | 11-317466 A | | 11/1999 |
| JP | 2001133515 A | * | 5/2001 |
| JP | 2001-318107 A | | 11/2001 |

* cited by examiner

SOCKET FOR INSPECTION

This application is a 371 of PCT/JP02/13865 filed on Dec. 27, 2002.

FIELD OF THE INVENTION

The present invention relates to a test socket that is used for electrically connecting to a test board an object to be tested, such as a circuit device, on which patterns are formed, like an integrated circuit, a printed circuit, or a liquid-crystal display panel.

DESCRIPTION OF THE RELATED ART

FIGS. 32 and 33 show the condition when the electrical conductivity of a circuit device 1 (as mentioned above) is being tested. A contact part 1a is pattern-formed on the circuit device 1, and the circuit device 1 is set inside a testing device 2 in order that the test can be conducted. The testing device 2 is equipped with a test board 3, on which electrode parts 3a are pattern-formed, and a contact probe 4 is mounted onto the test board 3.

As shown in FIG. 33, the contact probe 4 includes an insulative housing 4a, and conductive contact elements 4b, both of whose axial ends are needle-like, that are arranged parallel with each other in the housing 4a. The conductive contact elements 4b are accommodated in accommodation holes 4c that are formed so as to pass through the housing 4a perpendicular to the housing, and when the conductive contact elements are energized by coil springs 4d, both ends of the conductive contact elements 4b are energized in the axial direction so as to protrude from the housing 4a. The contact probe 4 is installed on the test board 3 in such a way that the ends of the conductive contact elements 4b on the side of the test board 3 can face the electrode parts 3a.

As shown in FIG. 32, when the contact probe 4 is installed on the test board 3, a fastening member 6, such as a screw, affixes a plate-like mounting member 5 to the test board 3. Because the mounting member 5 is affixed, the contact probe 4 is nipped between the test board 3 and the mounting member 5.

On the mounting member 5 is formed an opening 5a into which the circuit device 1 is inserted and set. Due to this insertion, a contact part 1a of the circuit device 1 is opposed to the conductive contact elements 4b of the contact probe 4, and the circuit device 1 is electrically connected to the test board 3 via the conductive contact elements 4b, making it possible to test the circuit device 1.

At the time of such a test, because it is necessary that the conductive contact elements 4b firmly contact both the electrode parts 3a of the test board 3 and the contact part 1a of the circuit device 1, a test socket is conventionally used for pressing the circuit device 1 against the contact probe 4.

FIGS. 34 and 35 show a conventional test socket 100. The test socket 100 is provided with (1) a base 110, which is fixed on a mounting member 5 of a testing device 2, and (2) a socket main body 120, which is attached to the base 110 in a condition of free rotation. An opening 113, into which the circuit device 1 is inserted, is formed on the base 110.

The socket main body 120 serves to open or close the opening 113 of the base 110, and it comprises (1) a frame 121 that is attached to the base 110 in a condition of free rotation, and (2) a pressing block part 122 that can move toward or away from the frame 121. Also, a lock part 123, which is detachably fastened by latches to the base 110, is mounted onto the frame 121.

A handle 124 is mounted onto the pressing block 122. The handle 124 has a shaft 126, on the outer periphery of which a screw portion 125 is formed. The screw portion 125 of the shaft 126 is engaged with a screw hole 127 that passes through the frame 121 in the perpendicular to the frame 121.

With such a structure, and in such a condition that the socket main body 120 is opened as shown in FIG. 34, the circuit device 1 is inserted in the opening 113 of the base 110. Thereafter, as shown in FIG. 35, the socket main body 120 is closed, and the lock part 123 is fastened to the base 110 in such a way that the closed condition is maintained. Under such a condition, the handle 124 is rotated in the threading direction. Due to this rotation, as shown in the right half of FIG. 35, because the shaft 126 moves in the plate-thickness direction of the frame 121, the pressing block part 122 presses the circuit device 1 against the contact probe 4, making it possible to test the circuit device 1.

FIGS. 36 and 37 show another conventional test socket 200. This test socket 200 is used for testing the conduction of a semiconductor package 210, which is a circuit device. Therefore, electrode parts that correspond to the terminals 211 of the semiconductor package 210 are formed on the test board 3.

The test socket 200 comprises: (1) a frame 220 that covers both the test board 3 and the semiconductor package 210, and (2) a lock part 230 that is attached to the outer surfaces of both sides of the frame 220. Also, the pressing block 240 that presses the semiconductor package 210 against the test board 3 is mounted onto the frame 220 on the frame's surface that faces the test board 3. The pressing block 240 is mounted onto the frame 220 via springs 250, such as compression springs.

Under such a condition, as shown in FIG. 36, after the semiconductor package 210 is mounted on the test board 3, the test socket 200 covers the test board 3. As shown in FIG. 37, the lock part 230 is fastened to the test board 3 by latches so that the closed condition is maintained. Because the springs 250 are compressed by this locking, the pressing block 240 presses the semiconductor package 210 against the test board 3 with the reaction force of the springs 250, which enables a test to be conducted.

However, as shown in FIGS. 34 and 35, a conventional test socket 100 needs fastening screws at the time of a test, resulting in bad operability. In addition, when the screws are fastened so as to press the pressing block 122 against the circuit device 1, the fastening strength differs depending on the person who fastens the screws. Therefore, it is difficult to perform tests under unvarying conditions, and therefore the test results are unreliable. Further, if the screws are fastened too weakly, the conduction of the circuit device 1 is not good, and if the screws are fastened too strongly, the circuit device 1 tends to be broken easily.

The test socket 200 shown in FIGS. 36 and 37 must be set against the spring force of the springs 250, and therefore when the spring force is too large, it is needlessly difficult for the operator to conduct a test. Further, when the lock part 230 is released to detach the test socket 200 from the test board 3, the test socket 200 is instantaneously detached by the reaction force of the springs 250, which is dangerous.

In view of such conventional problems, one object of the present invention is to provide a test socket that offers improved operability and high safety, and that applies unvarying pressing force onto the circuit device, making it possible to consistently perform tests whose results are reliable.

DISCLOSURE OF THE INVENTION

A test socket according to the invention of claim 1 is a socket for pressing an object to be tested against the testing face of a testing device. The socket comprises (1) a pressing member that flexibly presses the object to be tested against the testing face and that can be separated from the object to be tested after the test has been completed, and (2) an operating member that can rotate both in forward and reverse directions around the axis of the pressing member. Also, the pressing member and the operating member are engaged with each other so that the pressure on the object to be tested increases as the operating member rotates in the forward direction, and that the pressure decreases as the operating member rotates in the reverse direction.

According to the invention of claim 1, because the pressure of the pressing member increases due to forward rotation of the operating member and decreases due to reverse rotation of the operating member, the object to be tested can be pressed or released by rotating the operating member. In this invention, because the object to be tested is pressed against the testing face of the testing device by the pressure of the pressing member, it is possible to press the object with uniform pressure during each test and from test to test, and thus to perform tests whose results are reliable. When the operating member is rotated in the reverse direction, the pressure of the pressing member decreases, and so the pressing member can be easily and controllably separated from the object to be tested, resulting in improved safety.

A test socket according to the invention of claim 2 is a socket that presses an object to be tested against the testing face of a testing device, and that comprises
(1) a frame that (a) is detachably mounted onto a base that has an opening into which to set the object to be tested and that is mounted on said testing face, and (b) opens or closes said opening;
(2) an operating member (a) that has a shaft that is mounted onto the frame in such a manner as to rotate either forward or reverse within a predetermined angle, and (b) onto which engagement parts that protrude towards the object to be tested are formed; and
(3) a plate spring that (a) has spring pieces that stand at a specified angle along the rotation direction of said shaft and that slide together with said engagement parts, and (b) is mounted onto the shaft in such a way that it can move away from the object to be tested.

According to the invention of claim 2, when the shaft rotates, the engagement parts of the operating member slide together with the spring pieces of the plate spring. Because the spring pieces stand at a specified angle along the rotational direction of the shaft, when the shaft rotates in the forward direction while the engagement parts slide together with the spring pieces, the plate spring moves toward the object to be tested and presses the object to be tested against the testing face of the testing device. When the shaft rotates in the reverse direction, the plate spring's pressing force against the object to be tested is reduced, and the object can be released.

In this invention, because the plate spring is pressed against or released from the object to be tested by rotating the shaft in the forward or reverse direction, respectively, within a predetermined angle, operability is improved. Also, because the plate spring applies a constant load while pressing the object to be tested, the results of the test are reliable.

A test socket according to the invention of claim 3 is a socket for pressing an object to be tested against the testing face of a testing device, with said socket comprising a module that consists of
(1) an operating member (a) that has a shaft that can rotate in both the forward and reverse directions within a predetermined angle, and (b) on which engagement parts that protrude towards the object to be tested are formed; and
(2) a plate spring that (a) has spring pieces that stand at a specified angle along the rotation direction of said shaft and that slide together with said engagement parts, and (b) is mounted onto the shaft in such a way that it can move against, or away from, the object to be tested;
and with said test socket characterized such that the aforementioned shaft is detachably mounted to a frame that (a) is detachably mounted to a base that has an opening in which to set the object to be tested, and that is mounted on the testing face, and (b) opens or closes said opening.

In the invention of claim 3, when the shaft member rotates in the forward direction the plate spring presses against the object to be tested, and when the shaft member rotates in the reverse direction the plate spring's pressing force is reduced. Thus, the object to be tested can be pressed or released as the shaft rotates in the forward or reverse direction, respectively, within a predetermined angle. Thereby, operability is improved and tests whose results are reliable can be performed.

According to the invention of claim 3, a module is formed of both the operating member and the plate spring, and this module can be freely attached to or detached from the frame, so that the test socket can be used for a wide range of purposes.

An invention of claim 4 is a test socket as set forth in claim 2 or 3 and characterized such that the pressing/releasing member that presses said plate spring in such a way that said plate spring can be separated from the object to be tested, is installed on said test socket.

According to the invention of claim 4, because the plate spring is separated from the object to be tested by the pressure from the pressing/releasing member, the plate spring does not accidentally press the object to be tested, and therefore inappropriate testing can be prevented.

An invention of claim 5 is a test socket as set forth in any one of claims 2–4 and is characterized such that the interval control system that controls the interval between said object to be tested and the plate spring is installed between the shaft and the frame.

According to the invention of claim 5, because the interval between the plate spring and the object to be tested can be controlled by the interval control system, tests can be performed for a wide range of purposes, and the device can test various kinds of objects of differing thicknesses or sizes.

An invention of claim 6 is a test socket as set forth in any one of claims 2–5 and is characterized such that plural sets of the aforementioned engagement parts and spring pieces are arranged at equal intervals along the rotational direction of a shaft.

According to the invention of claim 6, because the plural sets of engagement parts and spring pieces are arranged at equal intervals, the pressure with which the plate spring presses against the object to be tested is uniform across the entire surface of the plate spring. Thereby, the object to be tested is pressed against the testing face in a uniform manner, so that tests whose results are reliable can be performed.

An invention of claim 7 is a test socket as set forth in claim 5 and is characterized such that
(1) said interval control system has at least two control plates, (a) that are placed against each other in such a way that they slide against each other, (b) through which the aforementioned shaft is inserted while the shaft's relative rotation against the frame is restrained, and (c) that are arranged between said frame and said shaft;
(2) one of the control plates can move perpendicular to the shaft; and
(3) the faces of said moving control plates are inclined in the direction of the movement of said control plate.

According to the invention of claim 7, because the faces of the control plates are inclined, when one of the control plates moves, the other plate moves perpendicular to the plate. After such movement, the shaft approaches or moves away from the frame, and therefore the interval between the plate spring and the object to be tested can be controlled. With such a structure, because the interval is controlled by the movement of one of the control plates, it is easy to control the interval. In addition, because the interval is controlled by the movement of a control plate whose inclination is continuous and not stepped, it is possible to control the interval precisely and in a continuous manner, without changing the pressures in steps or stages.

An invention of claim 8 is a test socket as set forth in claim 2 or 3 and is characterized such that (1) a support shaft for mounting said frame is formed on a base, (2) a fixing arm having an almost U-shaped groove, into which the support shaft can be inserted, is formed on the frame, and (3) parallel faces are formed on both the shaft and the fixing groove.

According to the invention of claim 8, the fixing arm does not detach from the support shaft unless the parallel faces (which are formed on both the support shaft and the fixing groove) face each other, and therefore the frame can be stably mounted onto the base. Also, because the fixing arm can be detached from the support shaft when the parallel faces face each other, the frame can easily be detached from the base.

An invention of claim 9 is a test socket as set forth in any one of claims 2–8, but which further comprises (1) a rotation plate that is arranged between the aforementioned engagement parts and the frame or the interval control system, and that can freely rotate around a shaft when the shaft is inserted through it, and (2) a slide member that is arranged between the rotation plate and the frame or the interval control system.

According to the invention of claim 9, the spheres (to be described below) rotate in the direction that is opposite to the shaft and the spheres as a result of the frictional force resulting from the rotation of the spheres. At this time, the upper surface of the rotation plate slides while making contact with the lower surface of a slide member. A friction-reducing member can be used as the slide member, so that the friction at the time of sliding can be reduced. In this way the amount of force necessary to operate the aforementioned handle can be reduced further.

An invention of claim 10 is a test socket as set forth in claims 2–9, further comprising
(1) a lock arm that (a) is rotatably mounted onto the aforementioned frame, and (b) maintains a condition whereby the frame opens and closes the opening of the base, and
(2) protrusions that (a) interlock with each other when said frame is closed, and (b) are formed on a handle that is affixed to the top end of the aforementioned shaft.

According to the invention of claim 10, when a test socket is fastened as described above, protrusion parts (which are set onto both the aforementioned handle and a lever that is installed onto the aforementioned lock arm) interlock with each other, so it is impossible to release the lock arm onto which the lever is installed. Thus, under this condition, the test socket cannot be released, and it is impossible to remove an object to be tested, namely a circuit device. Therefore, an inappropriate action (namely, accidental release of the test socket when the handle is closed) can be prevented.

An invention of claim 11 is a test socket as set forth in any one of claims 1–10 and is characterized such that
(1) said object to be tested is a circuit device onto which patterns are formed, and
(2) said testing device comprises (a) a test board onto which an electrode part is formed, and (b) a contact probe that is pressed by a coil spring and mounted onto said test board in such a way that plural conductive contact elements, both of whose axial ends are needle-like, that correspond to the electrode part are accommodated in a line in a housing, and such that the axial ends of the conductive contact elements protrude outside of the housing.

According to the invention of claim 11, because the circuit device and the test board are electrically connected via a contact probe, the circuit device can be tested in a reliable manner.

BEST MODE FOR CARRYING OUT THE INVENTION

Figure 1:
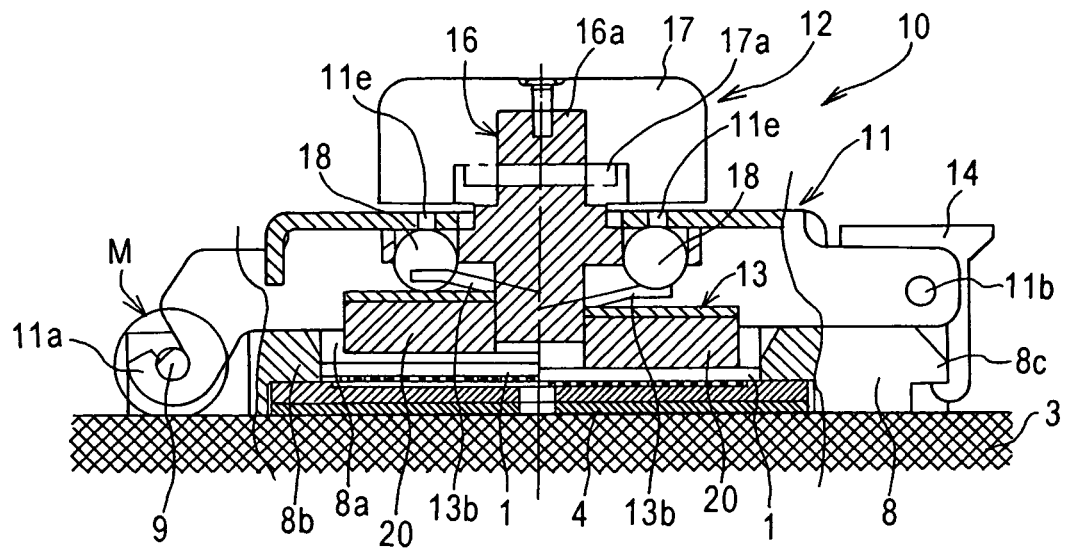
FIG. 1 is a vertical cross-sectional view of a first embodiment of the present invention.

The present invention will now be described more concretely with reference to embodiments shown in the drawings.

(First Embodiment)

Figure 2:
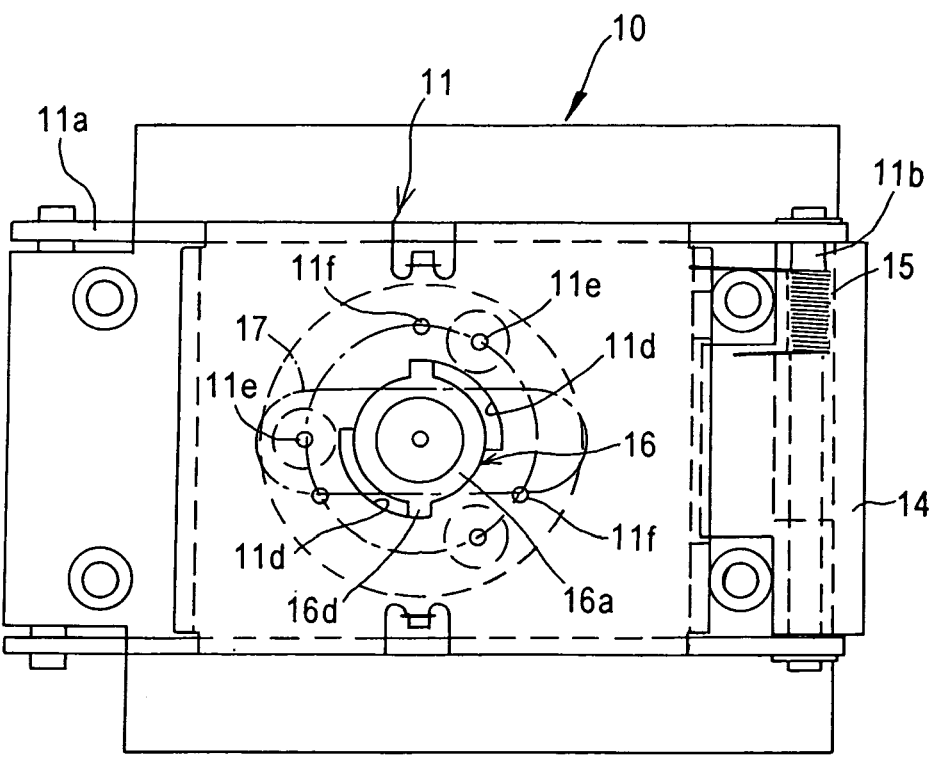
FIG. 2 is a horizontal plane view of the first embodiment.
Figure 3:
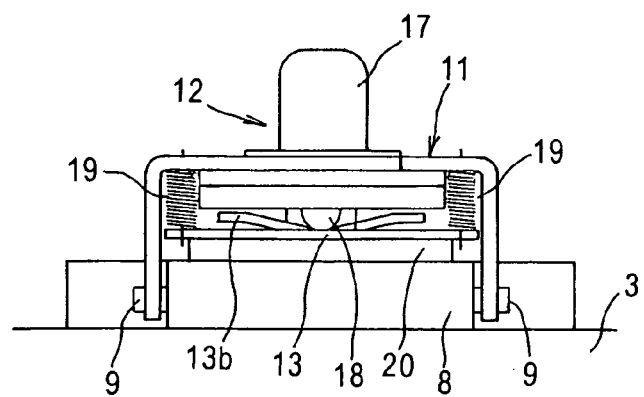
FIG. 3 is a side view of the first embodiment.

FIGS. 1–8 show a test socket 10 in a first embodiment of the present invention. FIG. 1 is a vertical cross-sectional view of the socket; FIG. 2 is a horizontal plane view thereof, and FIG. 3 is a side view thereof.

Figure 32:
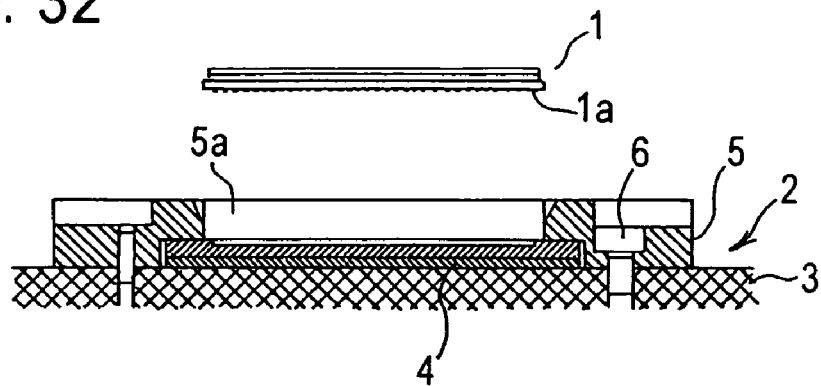
FIG. 32 is a vertical cross-sectional view showing a structure for testing a circuit device.
Figure 33:
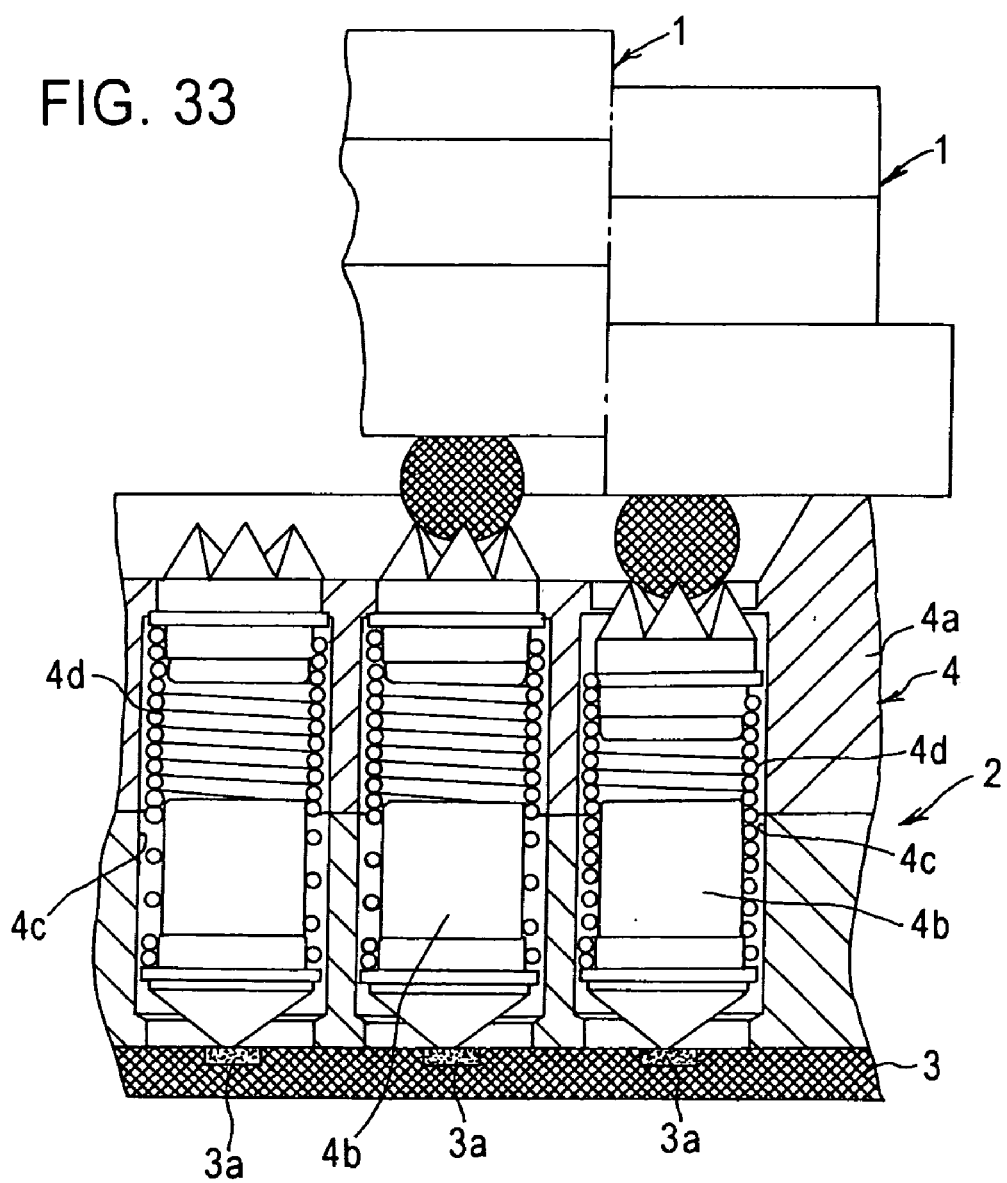
FIG. 33 is a vertical cross-sectional view illustrating the inside of a contact probe.
Figure 34:
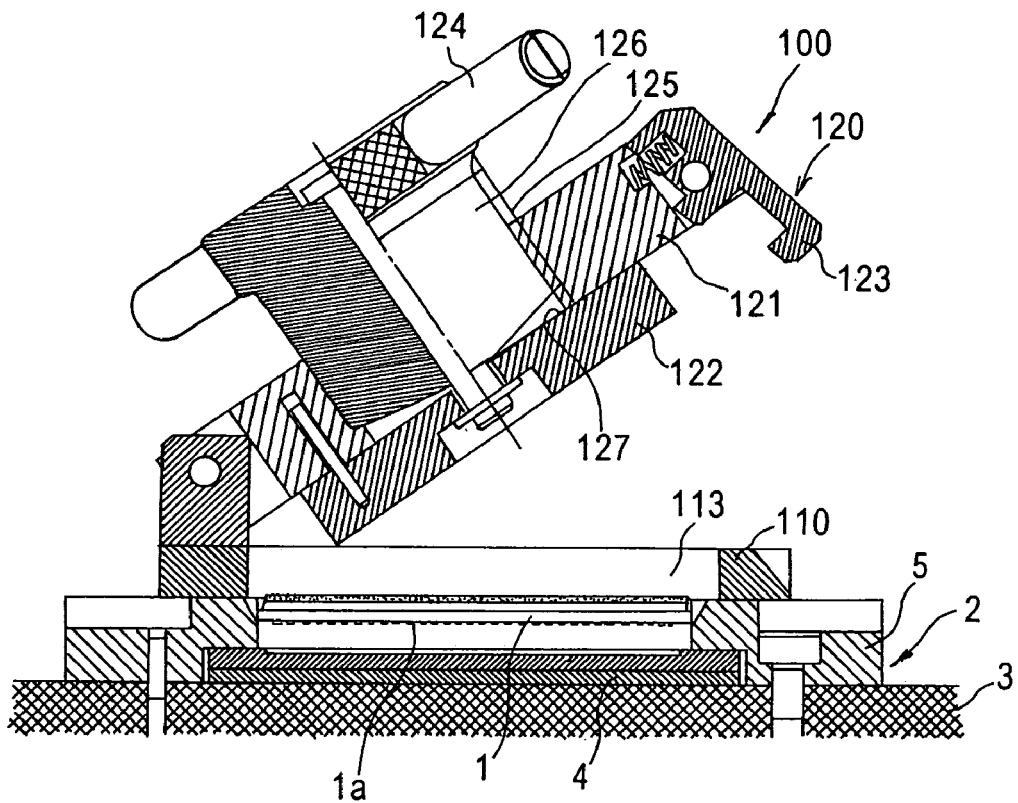
FIG. 34 is a vertical cross-sectional view of a conventional test socket before a test.
Figure 35:
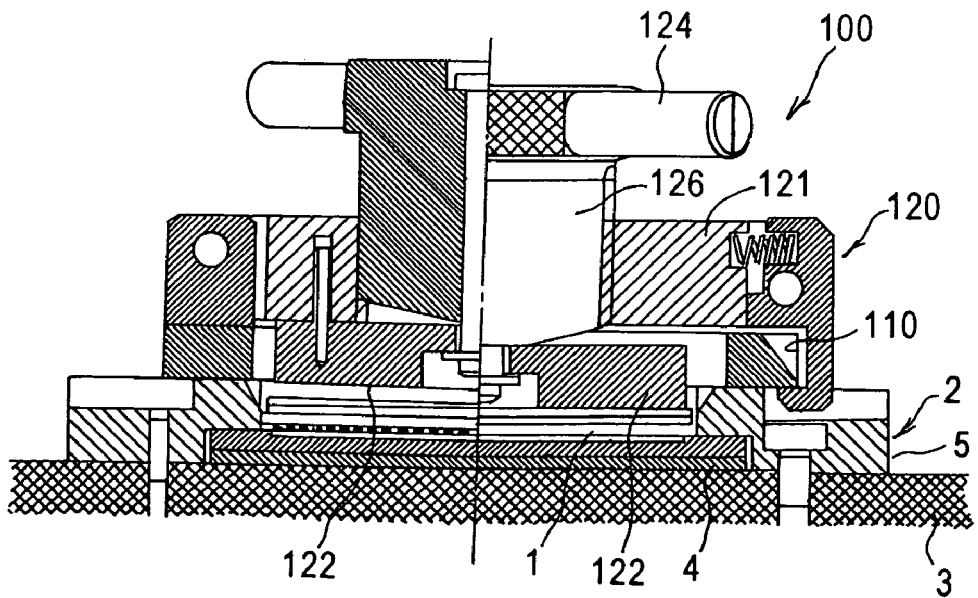
FIG. 35 is a vertical cross-sectional view of a conventional test socket during a test.
Figure 36:
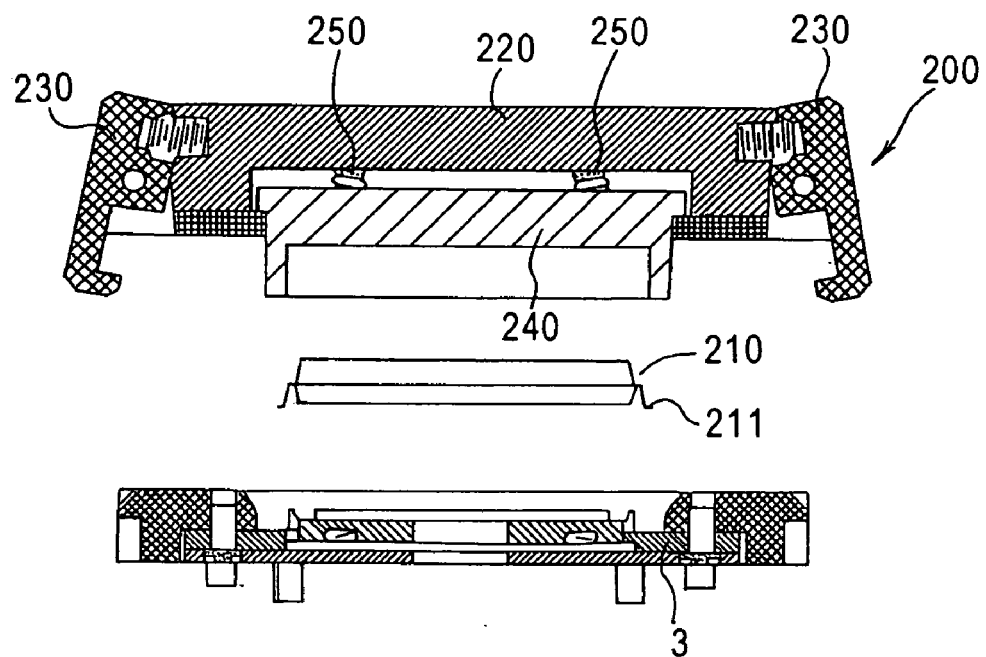
FIG. 36 is a vertical cross-sectional view of another conventional test socket before a test.
Figure 37:
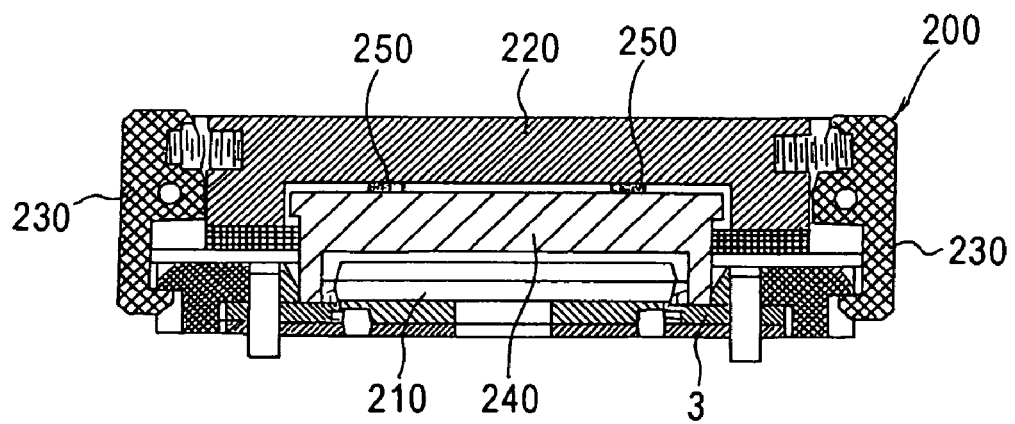
FIG. 37 is a vertical cross-sectional view of another conventional test socket during a test.

As shown in FIGS. 32 and 33, the test socket 10 in this embodiment is used to test a circuit device 1 via a contact probe 4 while the contact probe 4 is attached to a test board 3 onto which electrode parts are formed. Thus, the test board 3 is a testing device, and the circuit device 1 is an object to be tested. Also, the testing face is the upper surface of the contact probe 4 that faces the circuit device 1.

Figure 8:
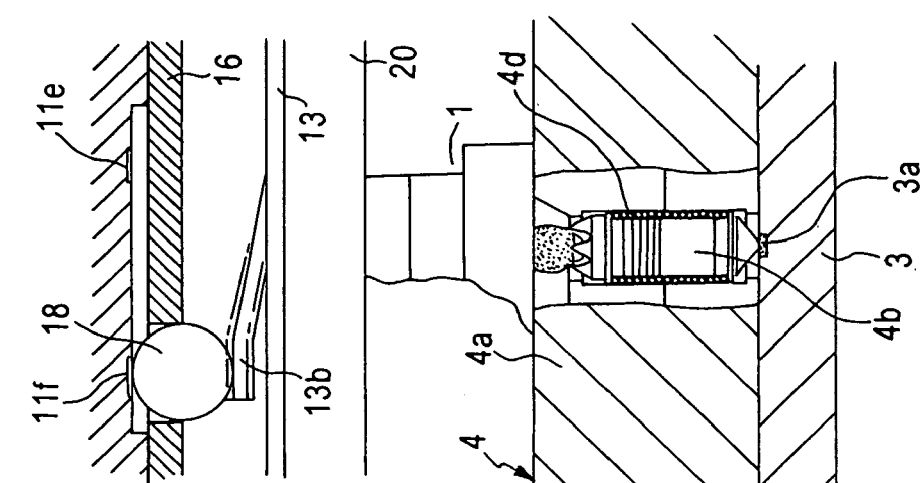
FIGS. 8(*a*)–8(*c*) are vertical cross-sectional views illustrating the order of actions of the first embodiment.

The contact probe 4 used in a first embodiment of the present invention is similar to that shown in FIG. 33. As shown in FIG. 8, the contact probe 4 is equipped with (1) an insulative housing 4a, and (2) conductive contact elements 4b, both of whose axial ends are needle-like, that are arranged in a line in the housing 4a, and the contact probe 4 is structured so that the conductive contact elements 4b are accommodated in accommodation holes 4c that pass through the housing 4 and are pressed by coil springs 4d in such a way that both of the axial ends of the conductive contact elements 4b are pressed in such a manner as to protrude from the housing 4a. The contact probe 4 is installed on the test board 3 in such a way that the ends of the conductive contact elements 4b on the side of the test board 3 can correspond to the electrode parts 3a.

As shown in FIG. 1, the contact probe 4 is mounted on the test board 3 via a base 8 that is affixed to the test board 3. The base 8 has an opening 8a into which the circuit device 1 is inserted. A step portion 8b that presses the contact probe 4 against the test board 3 is formed around the opening 8a. In addition, installed onto the base 8 is a support shaft 9 that in this embodiment supports the test socket 10 in a condition of free rotation. A hooking portion 8c for locking the test socket 10 in a closed condition is formed on the opposite side of the support shaft 9. Also, the contact probe 4 and the base 8 can be integrated and affixed to the test board 3.

The test socket 10 comprises a frame 11, an operating member 12 that is mounted onto the frame 11, and a plate spring 13 that is a pressing member and that moves in a direction (upward or downward) to enable it to press against, or move away from, the circuit device 1 by the operation of the operating member 12.

The frame 11 is formed into what is almost a rectangular shape when seen from above and into a horseshoe-like shape when seen from a side. The frame 11 can be freely attached to and detached from the base 8. For the purpose of attaching the frame 11 to the base 8, a fixing arm 11a, which is engaged with the support shaft 9, is formed on one end side in the lengthwise direction of the frame 11.

A lock arm 14 is attached to the frame 11 on the opposite side of the fixing arm 11a. The lock arm 14 is engaged with the hooking portion 8c of the base 8 so that the frame 11 can close the opening 8a of the base 8 (a closed condition of the test socket 10). The lock arm 14 is rotatably mounted onto a lock shaft 11b of the frame 11 and is pressed by a locking spring 15 (such as a torsion spring or a compression spring) in such a way that the lock arm 14 can rotate in the direction of engagement with the hooking portion 8c. Because the lock arm 14 is engaged with the hooking portion 8c, the closed condition of the test socket 10 can be maintained.

Figure 4A:
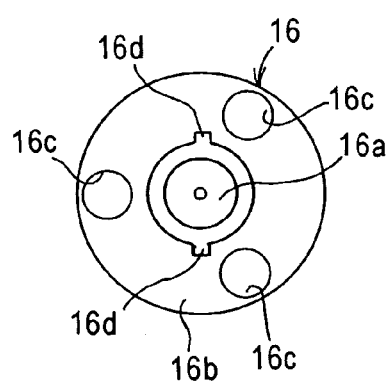
FIG. 4 shows a shaft that is used in the first embodiment; (a) is a horizontal-plane top view, (b) is a side view, and (c) is a horizontal-plane bottom view.
Figure 4B:
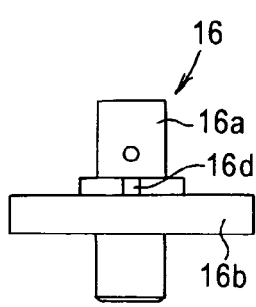
Figure 4C:
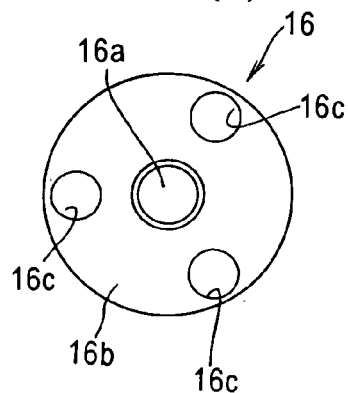

The operating member 12 is equipped with a shaft 16 that is operated so as to rotate while penetrating through the frame 11. FIG. 4 shows the shaft 16. The shaft 16 is structured by integrally forming (a) a rotating inner shaft 16a, and (b) a disc-like flange part 16b that extends from the shaft 16a in a direction perpendicular to the shaft's axial direction.

The rotating inner shaft 16a of the shaft 16 is a portion that serves as the rotational center of the operating member 12, and it protrudes in such a manner as to pass through the frame 11 from the bottom upward. A handle 17, which serves as a grip for rotating the operating member 12, can be detachably mounted to the extruding end of the shaft 16 that passes through the frame 11. The handle 17 is mounted to the operating member 12 by a pin 17a that is inserted along a line that is perpendicular to the shaft 16a.

The operating member 12 (including the shaft 16) is connected to the frame 11 in such a way that the shaft 16 can be rotated in either a forward or reverse rotation within a predetermined angle. Therefore, arc-shaped stopper-containing holes 11d, whose wall serves to restrain the rotation of the shaft 16 of a predetermined length are formed on the frame 11 (see FIG. 2), and stoppers 16d, which slide into said stopper-containing holes 11d are formed so as to protrude out of the rotating inner shaft 16a of the shaft 16.

The upper surface of the flange part 16b of the shaft 16 is brought into contact with the frame 11. Spheres 18 (as engagement parts) are provided with the flange part 16b. For the purpose of placing the spheres 18 onto the flange part 16b, ball holes 16c, into which the spheres 18 are moved in a condition of free rotation, are formed on the flange part 16b. Three ball holes 16c are formed around the rotational center of the shaft 16, at equal intervals along the periphery of the shaft 16. Thereby, the spheres 18 are also arranged at equal intervals along the peripheral direction of the shaft 16.

As engagement parts, the spheres 18 slide on the plate spring 13 and roll as the operating member 12 rotates, causing the plate spring 13 (which is to be described later) to move toward the circuit device. Because of the rolling of the spheres 18, operability is improved.

Click grooves 11e, 11f (which serve as parts that click) are formed on the frame 11 at the positions at which the rotation of the operating member 12 begins and ends. When the operating member 12 is rotated, the spheres 18 move into the click grooves 11e, 11f, giving the operator a clicking feeling on his/her hand from the test socket. As a result, the starting and ending points of the rotation can be confirmed, thereby improving operability.

Instead of spheres 18, rollers that rotate as the operating member 12 rotates can be assembled with the flange part 16b.

Figure 5A:
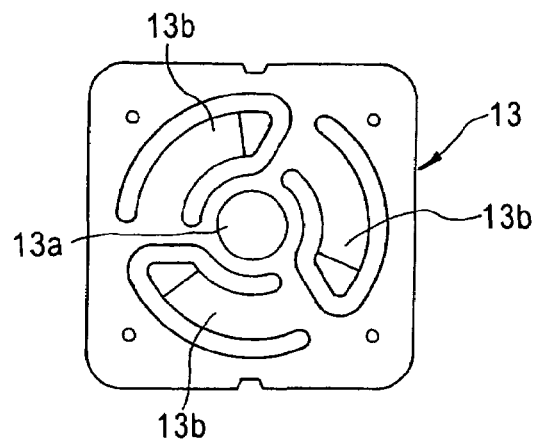
FIG. 5 shows a plate spring that is used in the first embodiment; (a) is a horizontal plane view, and (b) is a side view FIGS. 6(*a*) and (*b*) are partial horizontal-plane top views of a structure where a frame is mounted onto a base.
Figure 5B:

The plate spring 13, which serves as a pressing member, is mounted onto the shaft 16 of the operating member 12 so as to press the circuit device 1 against the contact probe 4. For the purpose of mounting the plate spring 13 onto the shaft 16, as shown in FIG. 5, a shaft hole 13a, through which the rotating inner shaft 16a of the shaft 16 passes, in turn constitutes the central portion of the plate spring 13 in the perpendicular to the plate spring 13. The diameter of the shaft hole 13a is slightly larger than the outside diameter of the rotating inner shaft 16a of the shaft 16, in such a way that the rotation of the shaft 16 is not transferred to the plate spring 13. Also, the plate spring 13 is molded into a rectangular shape when seen from above. The outside dimension of the plate spring 13 is slightly smaller than inside dimension of the frame 11 in the width direction, so that the plate spring 13 is positioned inside the frame 11 while it is attached to the shaft 16. With the above-mentioned structure, the plate spring 13 can move only so as to be separated from the circuit device 1 when rotation of the plate spring 13 is restrained.

Plural spring pieces 13b are formed on the plate spring 13. Each of the spring pieces 13b is formed in such a manner as to stand at a specified angle in the forward rotational direction of the shaft 16. Each of the spring pieces 13b slides while the spheres 18 roll on the side of said operating member 12. Accordingly, the number and positions of the spring pieces 13b correspond to those of the spheres 18 so as to form sets. The spheres 18 slide as the operating member 12 rotates, and the spheres 18 slide on the spring pieces 13b, so that the plate spring 13 moves downward so as to approach the circuit device 1.

In this embodiment, because the spheres 18 are arranged at equal intervals along the periphery of the shaft 16, the spring pieces 13b, which form sets with the spheres 18, are also arranged at equal intervals along the periphery of the shaft 16. As a result, the pressing force by which the plate spring 13 presses the circuit device 1 to the contact probe 4, is uniform across the entire surface of the circuit device 1. Thereby, the circuit device 1 can be uniformly pressed onto the contact probe 4, so that the results of tests on circuit devices 1 are continuously reliable.

The material used make the plate spring 13 is to be a material that has a spring-load that is sufficient to press the circuit device 1. For example, either SUS304-CSP or SK5 under the JIS standard is preferably used as a material for the plate spring 13.

A plate-like pressing block 20 of a predetermined thickness is mounted on the plate spring 13. The pressing block 20 is mounted onto the face that is opposite to the face on which the spring pieces 13b are formed (i.e., the pressing block is mounted on the face on the side of the circuit device 1), and it directly presses the circuit device 1. The pressing block 20 works as a buffer, and thus is made of plastic, rubber or other material that does not damage the circuit device 1. In this case, the shape of the pressing block 20 can be made similar to that of the plate spring 13, so as to restrain the rotation of the pressing block 20 against the frame 11, thereby indirectly restraining the rotation of the plate spring 13. Therefore, the forming of the shape of the plate spring 13 can be done more freely (i.e., the plate spring 13 can be made in any of a wide variety of shapes), as a result of which it is easy to make the plate spring 13 (because the plate spring does not have to be formed in such a shape that needs a great deal of precision).

In addition, in this embodiment, tensile springs 19 are installed as members that apply force to the plate spring 13 in such a way that the plate spring 13 can separate from the circuit device 1. As shown in FIG. 3, the tensile springs 19 bridge both the frame 11 and the plate spring 13. The tensile springs 19 pull up the plate spring 13 and thereby apply force to the plate spring 13 in such a way that the plate spring 13 can separate from the circuit device 1. Thus, under the normal condition, the plate spring 13 is separated from the circuit device 1 so that the plate spring 13 cannot accidentally press the circuit device 1, thereby preventing wrong operations.

How this embodiment operates will now be described. The left half of FIG. 1 shows the condition before the circuit device 1 is pressed, and the right half of FIG. 1 shows the condition when the circuit device 1 is pressed.

Figure 7:
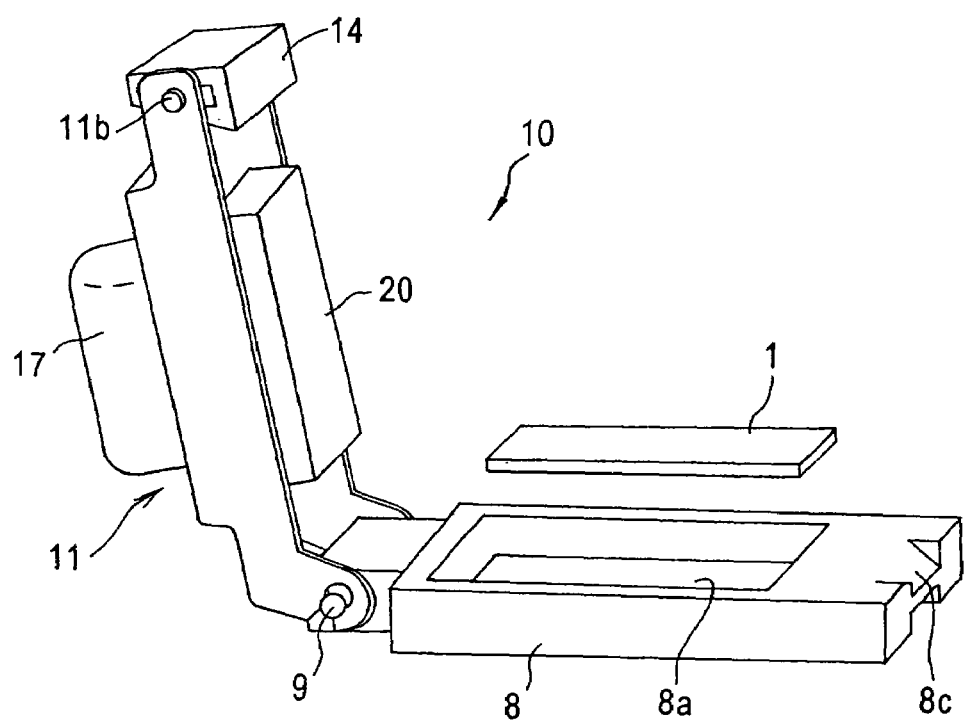
FIG. 7 is a perspective view of the first embodiment's frame in an open condition.

As shown in FIG. 7, the frame 11 is made to stand in an open condition, and the circuit device 1 is inserted into the opening 8a of the base 8. The frame 11 is rotated in the closing direction, and the lock arm 14 is engaged with the hooking portion 8c of the base 8 in such a way that the frame 11 is closed. And then, the handle 17 is rotated in the forward direction so as to do following operation.

FIG. 8 shows changes in how the spheres 18 act on the plate spring 13 as the handle 17 rotates in the forward direction. Before the handle 17 is rotated, because the plate spring 13 is pulled up by the tensile springs 19, as shown in FIGS. 3 and 8(a), each sphere 18 is positioned at the base of its corresponding spring piece 13b. Under such a condition, the plate spring 13 (namely the pressing block 20) is isolated from the circuit 1. Also, the spheres 18 are moved into the click grooves 11e that are formed at the starting end of the frame 11.

By rotating the handle 17 in the forward direction, the shaft 16 is rotated in the same direction. By this rotation of the shaft 16, the spheres 18 roll and move along the slope of the spring pieces 13b, and therefore the spring pieces 13b are flexed, as shown in FIG. 8(b). Because of the pressure of the spring pieces 13b, the plate spring 13 moves toward the circuit device 1, applying pressure to the circuit device 1. In this process, the plate spring 13 receives a reaction force from the coil springs 4d of the contact probe 4. However, adjustment of spring constant of the plate spring 13 is made in such a way that when the fastening is complete, the load applied to the circuit device 1 from the plate spring 13 can be higher than the reaction force from the contact probe 4, and, therefore, the plate spring 13 flexibly presses the circuit device 1. Also, even if there is dispersion in thickness of the circuit device 1, said dispersion can be compensated for by adjusting the amount of flexion of the plate spring 13

At the point where the rotation of the shaft 16 ends, the stopper 16d is brought into contact with the ends of the rotation-restraining holes 11d of the frame 11. At this time, as shown in FIG. 8(c), each sphere 18 reaches the top of its corresponding spring piece 13b, and all of the spring pieces 13b are flexed to the maximum level. Thereby, the plate spring 13 presses the circuit device 1 (via the pressing block 20) against the contact probe 4 at the maximum pressure (see the left half of FIG. 1). Thus, the circuit device 1 and the test board 3 electrically communicate with each other via the conductive contact elements 4b, so that the circuit device 1 can be tested.

At the point where the movement of the spheres 18 ends, each sphere 18 moves into its corresponding click grooves 11f that is formed at the end of the frame 11, and thus it is possible for an operator to recognize, by feeling a clicking on his/her hand, that the handle 17 has reached the endpoint of its rotation.

Adjustment of spring constant of the plate spring 13 is made in such a way that, during the above-mentioned operation, the total load PI>> of the plate spring 13 can be greater than the total load PC of the contact probe 4 including the coil spring 4d (namely, PI>PC). Further, the amount of PI is set at the lower limit of tolerance in the thickness of the circuit device 1. Thus, even when the thickness of the circuit device 1 reaches the upper limit of tolerance, only the plate spring 13 flexes further, and the "PI>PC" relationship can be maintained. Thereby, it is possible to press the circuit device 1 against the contact probe 4.

The pressure on the circuit device 1 can be released by rotating the handle 17 in the reverse direction so as to rotate the shaft 16 in the same reverse direction. When the shaft 16 is rotated in the reverse direction, the spheres 18 move the spring pieces 13b in the direction opposite to the above-mentioned direction, thereby reducing the flexion of the spring pieces 13b. In addition, because the plate spring 13 is pulled up by the tensile springs 19, the plate spring 13 returns to its initial condition (see the right half of FIG. 1).

In such an embodiment, because the forward and reverse rotations of the shaft 16 allow the plate spring 13 to be pressed against or released from the circuit device 1, operability can be improved. Also, the plate spring 13 presses the circuit device 1 at a constant load, resulting in reliable tests. When the pressure is to be released, the reverse rotation of the shaft 16 gradually reduces the pressure of the plate spring 13, and therefore this device can be operated safely.

FIG. 6 shows the relationship between the support shaft 9 and the fixing arm 11a of the frame 11 in this embodiment. A U-shaped mounting groove 11g, into which the support shaft 9 is inserted, is formed on the fixing arm 11a. Also, a flat portion 9h, which is perpendicular to the diameter direction of the support shaft 9, is formed at one part of the support shaft 9, and a flat portion 11h is also formed on the mounting groove 11g.

Figure 6A:
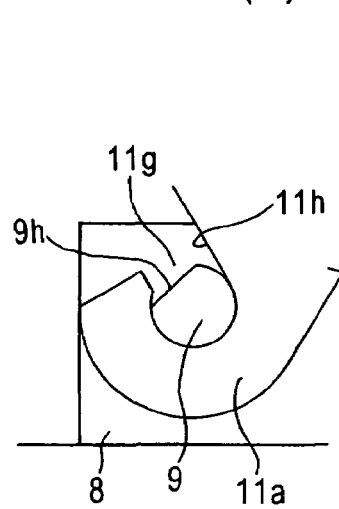
Figure 6B:
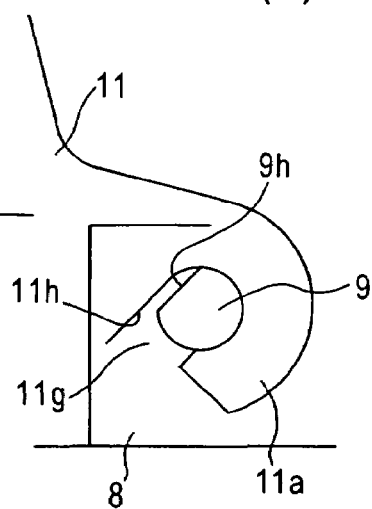

Because of the above-mentioned structure, as shown in FIG. 6(a), the fixing arm 11a does not get detached from the support shaft 9 unless the parallel faces 9h and 11h (which are formed on the support shaft 9 and the mounting groove 11g, respectively) face each other. Thereby, the frame 11 can be mounted onto the base 8, and the frame 11 can be rotated stably. In addition, as shown in FIG. 6(b), when the parallel faces 9h and 11h are facing each other, the fixing arm 11a (frame) can be detached from the support shaft 9. Thereby, the frame 11 can be easily detached from the base 8.

Further, the relationship between the support shaft 9 and the fixing arm 11a is not limited to the above. The support shaft 9 can be formed into a normal shaft, whose cross-section is a circular shape, and the mounting groove 11h of the fixing arm 11a can be a normal circular groove.

(Second Embodiment)

Figure 9:
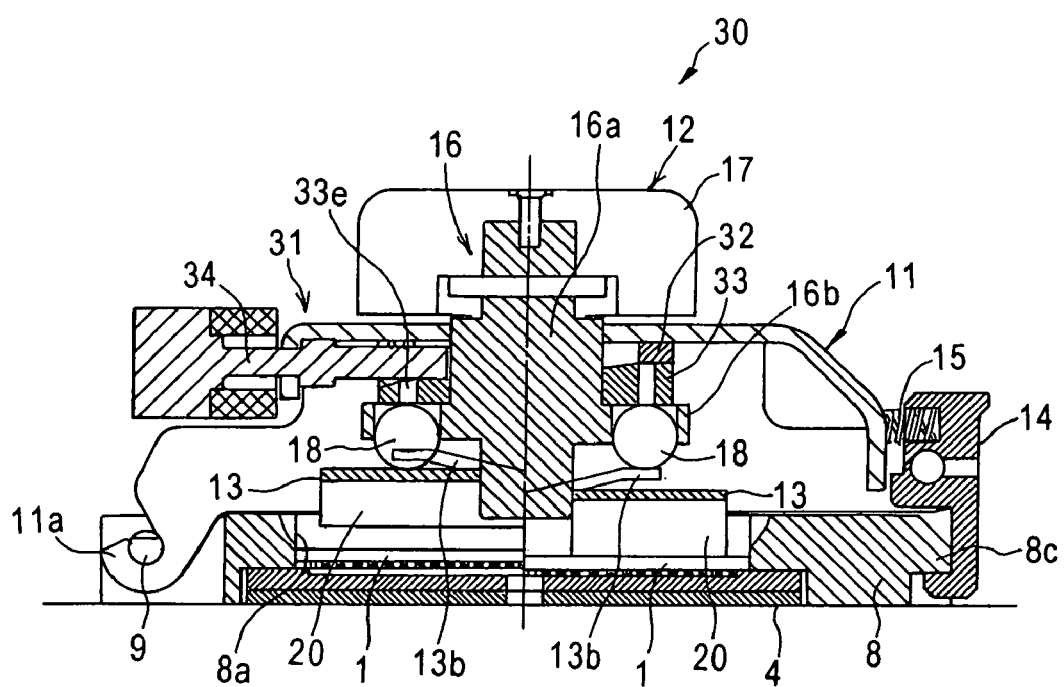
FIG. 9 is a vertical cross-sectional view of a second embodiment of the present invention.
Figure 10:
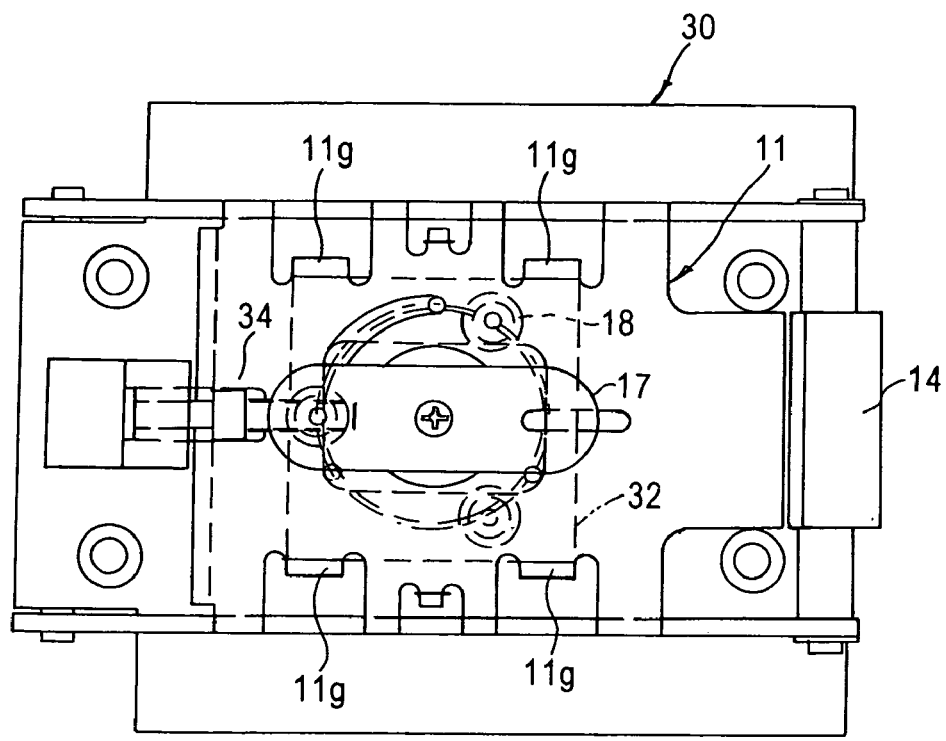
FIG. 10 is a horizontal plane view of the second embodiment.

FIGS. 9–13 show a test socket 30 in a second embodiment of the present invention. The left half of FIG. 9 shows the condition before a circuit device 1 is pressed, and the right half of FIG. 9 shows the condition when a circuit device 1 is pressed.

The test socket 30 in this embodiment has an interval control system 31. The interval control system 31 is arranged between a frame 11 and a flange part 16b of the shaft 16, and it serves to control the interval between the plate spring 13 and the circuit device 1 so that the load of a plate spring 13 that is applied to the circuit device 1 can be controlled.

The interval control system 31 comprises (a) a first control plate 32, (b) a second control plate 33 (the first control plate 32 is overlaid on the second control plate 33), and (c) an adjusting rod 34 for adjusting the interval. The first control plate 32 is brought into contact with the bottom face of the frame 11, while the second control plate 33 is brought into contact with the top face of the flange part 16b of the shaft 16. The adjusting rod 34 is mounted on the first control plate 32, under the condition that the adjusting rod 34 is parallel to the frame 11.

Figure 12A:
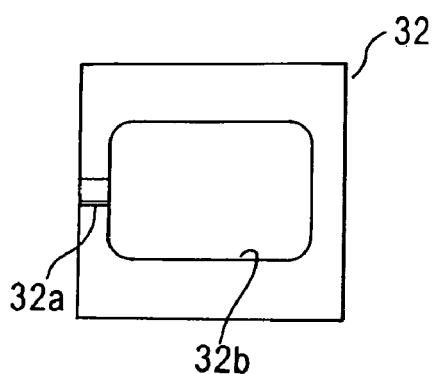
FIG. 12 shows an interval control system; (a) is a horizontal plane view of a first control plate, and (b) is a horizontal plane view of a second control plate.

As shown in FIG. 12, a tap part 32a, with which the adjusting rod 34 is engaged, is formed on the first control plate 32. Also, a long hole 32b, into which the rotating inner shaft 16a of the shaft 16 is inserted, is formed in the first control plate 32. The long hole 32b extends in the lengthwise direction of the adjusting rod 34. As a result, when the adjusting rod 34 is rotated and operated, the first control plate 32 can move horizontally, which is perpendicular to the rotating inner shaft 16a of the shaft 16.

A circular shaft hole 33a, through which the rotating inner shaft 16a of the shaft 16 passes, is formed on the second control plate 33. The diameter of the shaft hole 33a is as large as or slightly larger than the outside diameter of the rotating inner shaft 16a of the shaft 16, and the shaft 16a can pass through the shaft hole 33a in a condition of free rotation. Because the rotating inner shaft 16a of the shaft 16 passes through the shaft hole 33a, horizontal movement of the second control plate 33 is restrained, and the second control plate 33 can move up or down along the axial direction of the shaft 16a.

Click holes 33e, 33f, which are similar to the click grooves 11e, 11f in the first embodiment, are formed on the second control plate 33. As shown in FIG. 9, plural spheres 18 are inserted into the flange part 16b of the shaft 16 at equal intervals along the periphery of the flange part 16b. One part of each sphere 18 protrudes upward from the flange part 16b, and the protruding portion is bought into contact with the bottom face of the second control plate 33. As a result, the spheres 18 can move into the click holes 33e, 33f, giving the operator a clicking feeling on his/her hand, whereby it is possible for the operator to recognize the beginning and ending points of the rotation of the shaft 16, as is similar to the first embodiment.

The first control plate 32 and the second control plate 33 have an inclined face 32c and an inclined face 33c, respectively; and the inclined face 32c is overlaid on the inclined face 33c. The inclined faces 32c, 33c are inclined in the direction that the long hole 32b of the first control plate 32 extends. The inclinations of the inclined faces 32c, 33c are almost identical to each other, inclined face 32c is overlaid on inclined face 33c, and they are inclined in opposite directions. Because inclined face 32c is overlaid on inclined face 33c under the condition that they are inclined in opposite directions, when one control plate (the first control plate 32) moves, the other control plate (the second control plate 33) must move in the opposite direction.

Figure 11:
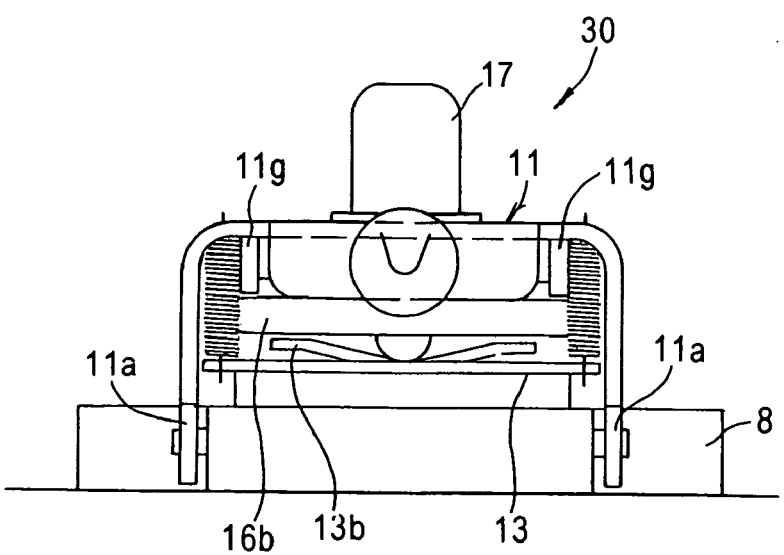
FIG. 11 is a side view of the second embodiment.

The first control plate 32 and the second control plate 33 are molded into a rectangular shape, when seen from above, and protrusions 11g, with which the side faces of the control plates 32, 33 are brought into contact, are formed on the frame 11 (see FIG. 11). The protrusions 11g slide while contacting the side faces of the control plates 32, 33, thereby restraining the rotation of the control plates 32, 33. Under such a condition, the first control plate 32 moves only linearly in a horizontal direction, and the second control plate 33 only moves up or down.

Figure 13A:
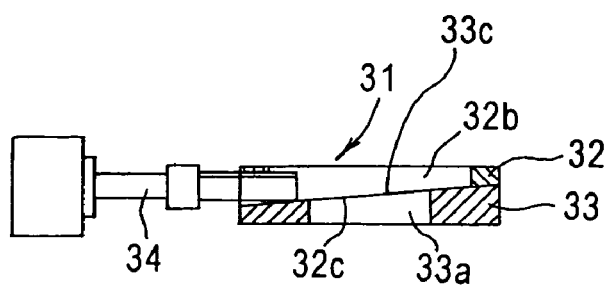
FIGS. 13(*a*) and (*b*) are vertical cross-sectional views illustrating actions of the interval control system.
Figure 13B:
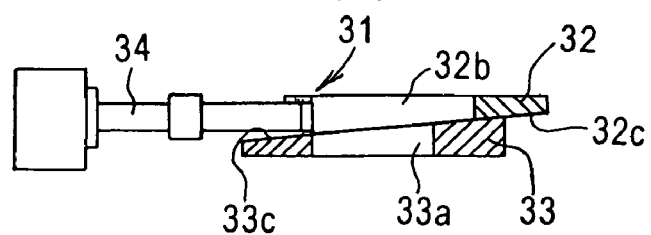

In this embodiment, when the adjusting rod 34 is rotated in one direction so as to linearly move the first control plate 32 forward, the first control plate 32 slides as shown in FIG. 13. When the first control plate 32 slides, the second control plate 33, whose inclined face 33c is under the inclined face 32c of the first control plate 32, moves (downward) toward the plate spring 13 according to the angle of inclination of the inclined faces 32c and 33c. By this movement, the shaft 16, whose flange part 16b is in contact with the second control plate 33, moves in the same direction, so that the spring pieces 13b, which are in contact with the spheres 18 of the flange part 16b, are flexed, and so that the plate spring 13 is pressed down so as to move toward the circuit device 1. As a result, it is possible to control the interval between the spring plate 13 and the circuit device 1. When the adjusting rod 34 is rotated in the reverse direction, the second control plate 33 moves upward so as to separate from the plate spring 13. As a result, the plate spring 13 moves so as to separate from the circuit device 1. Therefore, the interval can be controlled in the reverse direction in a manner similar to the above.

In this embodiment, and as is similar to the first embodiment, spring pieces 13b are formed on the plate spring 13, and the spring pieces 13b are flexed due to the movement of the spheres 18 that results from the forward rotation of the shaft 16, which constitutes the operating member 12, so that the plate spring 13 flexibly presses the circuit device 1 (via the pressing block 20) against the contact probe 4. Therefore, and as is similar to the first embodiment, the circuit device 1 can be electrically tested.

In addition, in this embodiment, because the interval between the plate spring 13 and the circuit device 1 can be controlled by the interval control system 31, it is possible to test circuit devices 1 of different thicknesses. Also, the fastening load from the plate spring 13 can be controlled for multiple circuit devices 1 of the same thickness, because the flexion volume of the plate spring 13 can be changed. Accordingly, this invention can cope with changes in the number of conductive contact elements 4b of the contact probe 4 that contacts with the circuit device 1.

Furthermore, as to the interval control system 31, the inclined faces 32c and 33c are formed so that their faces incline evenly and continuously, without being stepped, and the faces 32c and 33c control the interval between the plate spring 13 and the circuit device 1 via the sliding of the first and second control plates 32 and 33. Therefore, it is possible to control the interval precisely and continuously, without steps or stages.

In this embodiment, the first and second control plates 32 and 33 are brought into contact with the protrusions 11g of the frame 11. However, the invention is not limited to the above structure, and the first and second control plates 32 and 33 can be brought into contact with (a) linear guide grooves, (b) guide protrusions that are engaged with guide grooves, or (c) the inner side of the frame 11.

(Third Embodiment)

FIGS. 14–17 show a test socket 40 in a third embodiment of the present invention. In this embodiment, spring pieces 13b are formed on each of multiple plate spring 13, and the spring pieces 13b are flexed by the movement of spheres 18 that results from the rotation of a shaft 42 that constitutes one part of an operating member 12. Because an interval control system 31 is installed, the interval between the frame 11 and a plate spring 13 can be controlled.

Figure 16:
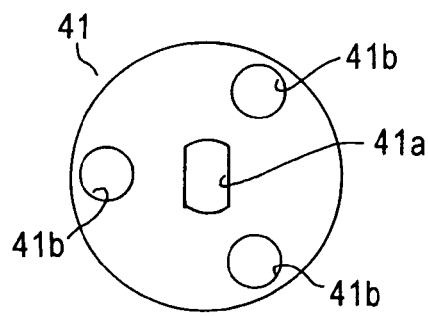
FIG. 16 is a horizontal plane view of a rotation plate that is used in the third embodiment.

In this embodiment, a rotation plate 41 is attached to a shaft 42 that can rotate in both the forward and reverse directions. As shown in FIG. 16, the rotation plate 41 is made of a disc and a noncircular shaft hole 41a that is in the center of the rotation plate 41. The shaft 42 passes through the shaft hole 41a, thereby attaching the rotation plate 41 to the shaft 42. A handle 17 for rotating the shaft 42 is fixed by a screw 44 at the top end of the shaft 42. (See FIG. 14)

Figure 15A:
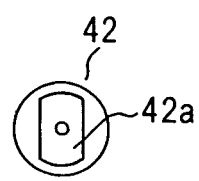
FIG. 15 shows a shaft that is used in the third embodiment; (a) is a horizontal plane view, (b) is a vertical cross-sectional view, and (c) is a side view.
Figure 15B:
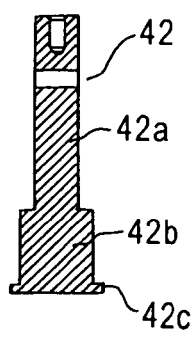
Figure 15C:
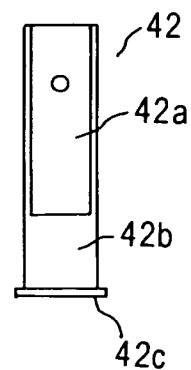

As shown in FIG. 15, the shaft 42 comprises (a) a upper shaft portion 42a that is formed into a noncircular outer shape and that corresponds to the shaft hole 41a of the rotation plate 41, (b) a lower shaft portion 42b whose outer shape is circular and that is connected with the bottom of the upper shaft portion 42a, and (c) a jaw part 42c that has a slightly larger diameter than that of the lower shaft portion 42b and that is formed at the bottom end of the lower shaft portion 42b. The upper shaft portion 42a passes through the shaft hole 41a of the rotation plate 41, and the rotation plate 41 is mounted on the shaft 42 in such a way that the rotation plate 41 can rotate integrally with the shaft 42. Also, the rotation plate 41 is brought into contact with the step portion formed at the boundary between the upper shaft portion 42a and the lower shaft portion 42b, so that the rotation plate 41 is prevented from coming off the shaft 42.

Figure 12B:
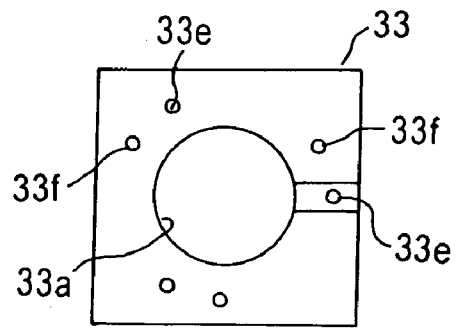
Figure 14:
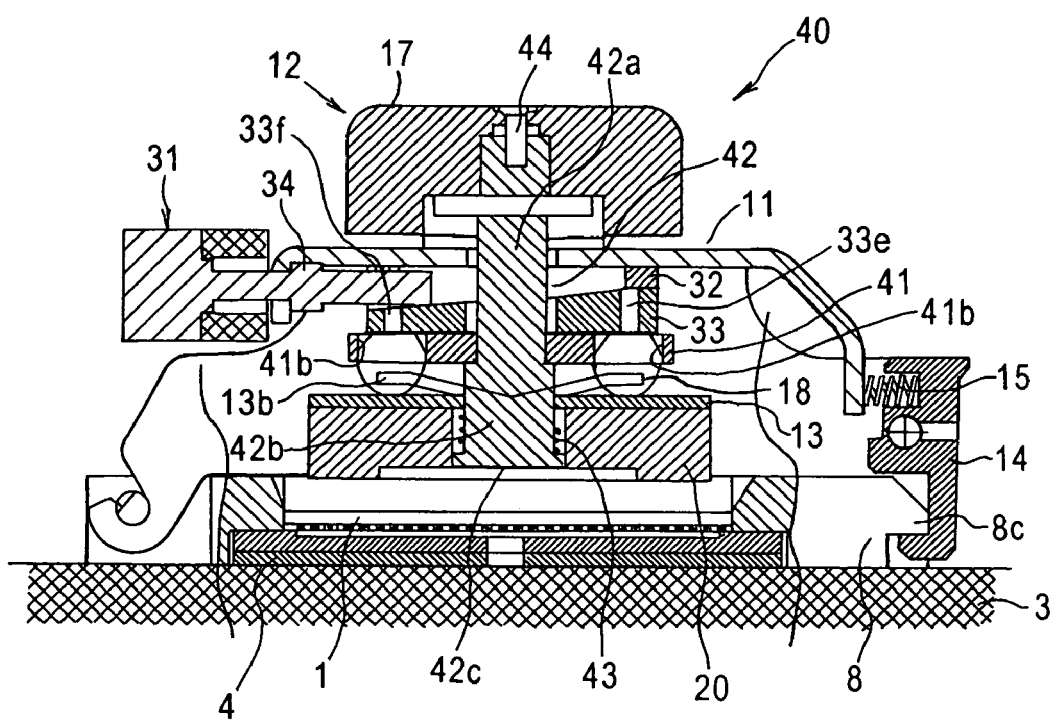
FIG. 14 is a vertical cross-sectional view of a third embodiment of the present invention.

Three through holes 41b, which extend perpendicular to the rotation plate 41, are formed on the rotation plate 41 at equal intervals. As shown in FIG. 14, the spheres 18 that move along the spring pieces 13b of the plate spring 13 move into the through holes 41b. When the rotation plate 41 rotates along with the rotation of the shaft 42, the spring pieces 13b are flexed by the spheres 18, and the plate spring 13 flexibly presses the circuit device 1 onto the contact probe 4. In addition, as shown in FIG. 12(b), the click holes 33e and 33f, which are to cause a clicking feeling when the spheres 18 move into them, are formed on the second control plate 33 of the interval control system 31.

In such an embodiment, the rotation plate 41 works similar to the flange part 16*b* of the first and second embodiments, and it is separated from the shaft 42, which corresponds to the flange 16*b*. Under a structure such that the shaft 42 and the rotation plate 41 are separate from each other, the outer shape of the shaft 41 becomes simple, so it is easy to process the shaft 41, which is one advantage of this invention.

Figure 17:
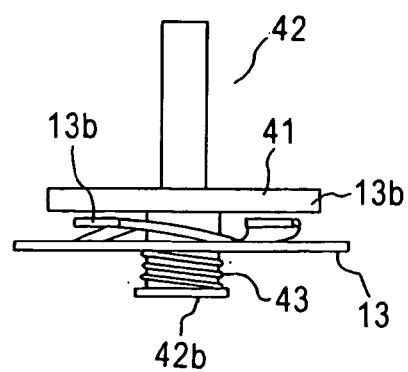
FIG. 17 is a side view illustrating the relationship of a compression spring and a plate spring that are used in the third embodiment.

A compression spring 43 is attached to the second shaft 42*b* of the shaft 42. As shown in FIGS. 14 and 17, the bottom end of the compression spring 43 is prevented from coming off by the jaw part 42*c*, while the top end of the compression spring 43 is prevented from coming off by being pressed by the plate spring 13.

The compression spring 43 is attached to the shaft 42 while the compression spring 43 is compressed at its bottom and top ends by the jaw part 42*c* and the plate spring 13, respectively, so that the plate spring 13 is pressed upward so as to be separated from the circuit device 1. Thus, the compression spring 43 works as a member that can press the plate spring 13 against the circuit device 1 or release the plate spring 13 from the circuit device 1.

With such a structure, when the shaft 42 is rotated in the forward direction, the spring pieces 13*b* are flexed by the spheres 18. Therefore, the plate spring 13 flexibly presses the circuit device 1 (via a pressing block 20) to the contact probe 4, and the circuit device 1 is electrically tested. When the shaft 42 is rotated in the reverse direction, the plate spring 13 is separated from the circuit device 1 due to a spring force of the compression spring 43. Therefore, the plate spring 13 does not accidentally press the circuit device 1 onto the contact probe 4, so that wrong operations are prevented.

Further, because the compression spring 43 as a pressing/releasing member is mounted so that the compression spring 43 is nipped between (a) the jaw part 42*c* of the shaft 42 and (b) the plate spring 13, the compression spring 43 does not come off the shaft 42, so that the plate spring 13 is pressed upward so as to be separated from the circuit device 1.

(Fourth Embodiment)

Figure 18:
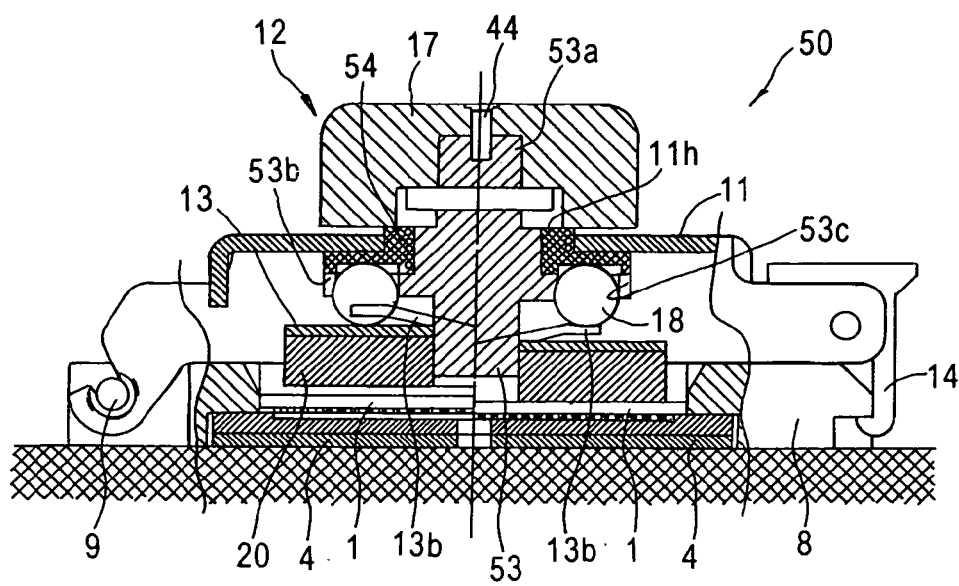
FIG. 18 is a vertical cross-sectional view of a fourth embodiment of the present invention.
Figure 19:
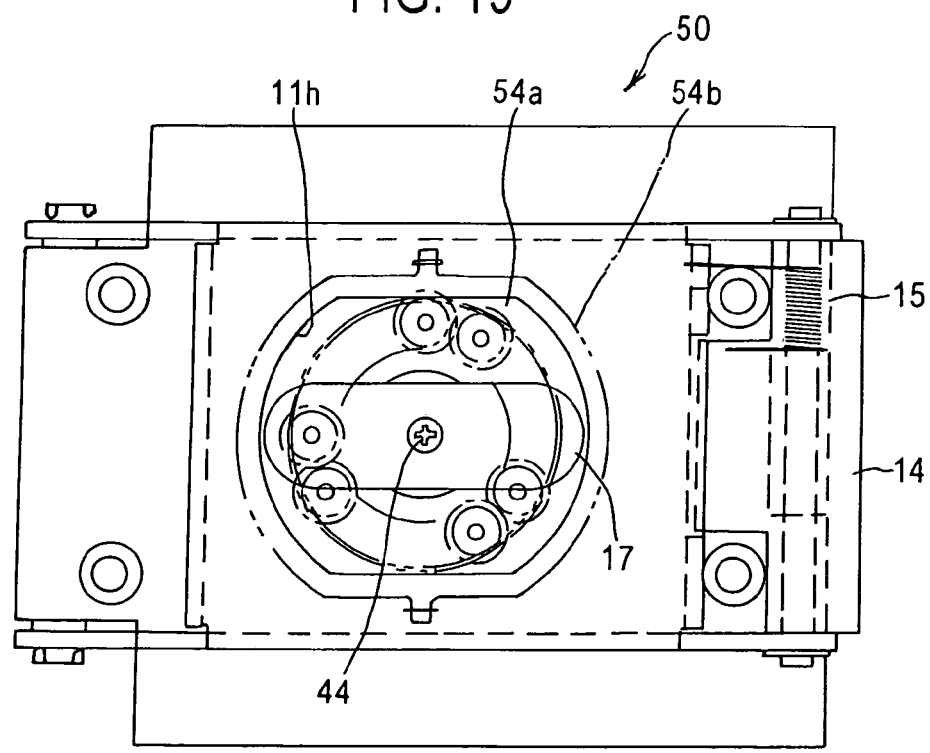
FIG. 19 is a horizontal plane view of the fourth embodiment.
Figure 20:
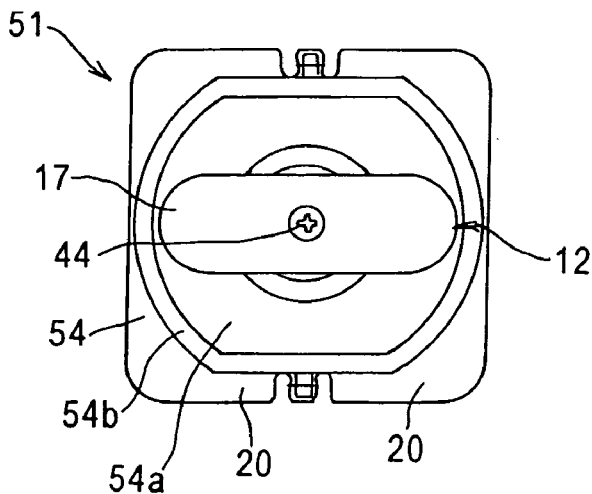
FIG. 20 is a horizontal plane view of a module that is used in the fourth embodiment.
Figure 21:
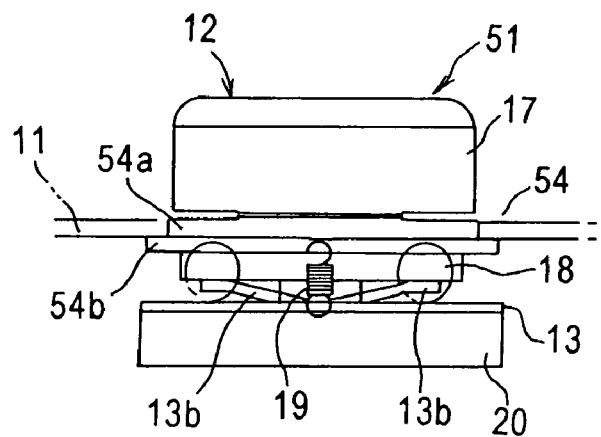
FIG. 21 is a side view of a module.
Figure 22:
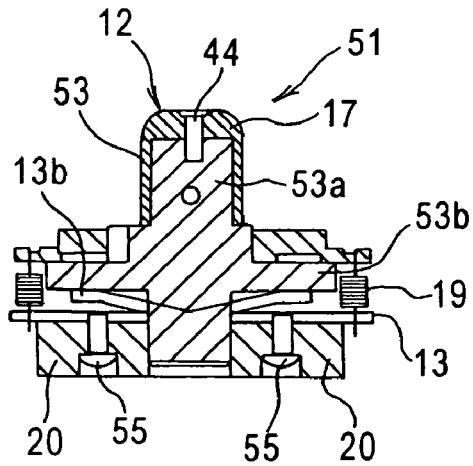
FIG. 22 is a vertical cross-sectional view of the module.

FIGS. 18–23 show a test socket 50 in a fourth embodiment of the present invention. The left half of FIG. 18 shows the condition before the circuit device 1 is pressed, and the right half of FIG. 18 shows the condition when the circuit device 1 is pressed. In this embodiment, as shown in FIGS. 20–22, a module 51 serves as a mechanism for pressing a circuit device 1 onto a contact probe 4, and the module 51 is detachably mounted on the frame 11. The module 51 is constituted by assembling an operating member 12 and a plate spring 13 together.

The operating member 52 of the module 51 is equipped with a shaft 53, a bush 54, and a handle 17 that is installed on the top end of the shaft 53.

The shaft 53 is formed so that (a) a rotating inner shaft 53*a* and (b) a flange part 53*b*, which extends from the shaft 53*a* along a line perpendicular to the shaft 53*a*, are integrally formed. The handle 17 is affixed by a screw 44 onto the top end of the shaft 53*a*. When the handle 17 is rotated in either the forward or reverse direction, the shaft 53 can rotate in the same direction as the handle. The bottom end of the shaft 53*a* is inserted into the shaft hole 13*a* of the plate spring 13.

Three spheres 18 are arranged as engagement parts at equal intervals along the periphery of the flange part 53*b*. For the purpose of arranging the spheres 18, three through holes 53*c*, into which the spheres 18 are partially inserted, are formed along the periphery of the flange part 53*b* at equal intervals. The spheres 18 are partially inserted into the through holes 53*c* when one part of each of the spheres 18 protrudes upward through its corresponding hole 53.

Figure 23A:
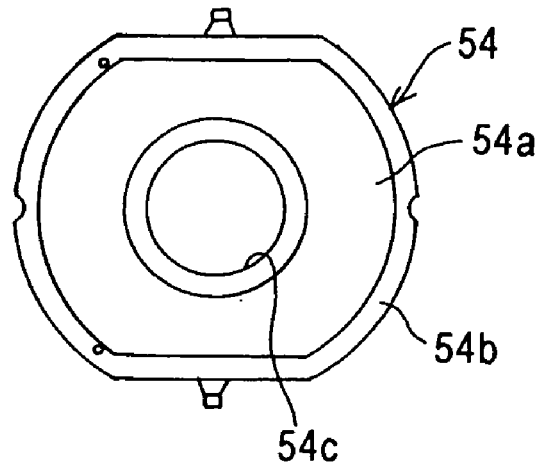
FIG. 23 shows a bush that is used in the fourth embodiment; (a) is a horizontal plane view, (b) is a side view, and (c) is a horizontal-plane bottom view.
Figure 23B:
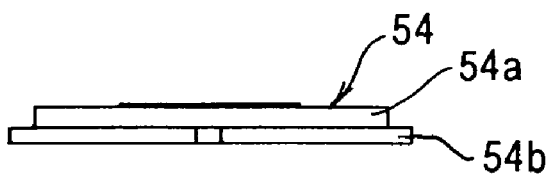
Figure 23C:
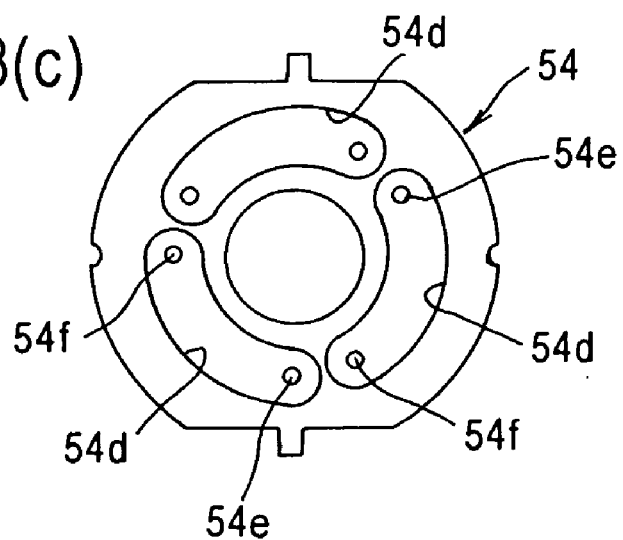

The bush 54 has a stepped structure comprising an upper bush portion 54*a* and a lower bush portion 54*b*. FIG. 23 shows the bush 54, at the center of which is a shaft hole 54*c* through which a rotating inner shaft of the shaft 53 passes in a condition of free rotation. As shown in FIG. 20, the upper bush portion 54*a* and the lower bush portion 54*b* are have noncircular shapes, and the lower bush portion 54*b* is formed into a flange that has an area larger than that of the upper bush portion 54*a*. The upper bush portion 54*a* is pressure-inserted into a bush hole 11*h* that is formed on the frame 11. As a result, the bush hole 11*h* is molded into a noncircular shape that corresponds to that of the upper bush portion 54*a*.

When the upper bush portion 54*a* is pressure-inserted into the bush hole 11*h* of the frame 11, the bush 54 is prevented from rotating. At this time, the lower bush portion 54*b* is brought into contact with the bottom surface of the frame 11. Also, the top surface of the bush 54 is brought into contact with the flange part 53*b* of the shaft 53; and the handle 17 is affixed to the shaft 53*a* of the shaft 53. With the above-mentioned structure, because the frame 11 is nipped between the handle 17 and the bush 54, the shaft 53 is prevented from coming off from the frame 11.

As shown in FIG. 23, arc-shaped guide grooves 54*d*, inside which the spheres 18 move, are formed on the bottom surface of the bush 54. The guide grooves 54*d* serve to restrain the movement range of the spheres 18, and click holes 54*e* and 54*f* are formed at positions that correspond to the starting and ending points of the movement of the spheres 18 (the starting and ending points of the rotation of the shaft 53), respectively.

The plate spring 13 is connected with the end of the bush 54 via tensile springs 19. Accordingly, the plate spring 13 is affixed to the bush 54 so that the plate spring 13 can be pulled upward and separated from the circuit device 1. A pressing block 20 is affixed with screws 55 to the bottom surface of the plate spring 13 (see FIG. 22). Furthermore, the corresponding spheres 18 are brought into contact, in a free-rolling condition, with the spring pieces 13*b* that stand at a specified angle from the plate spring 13. With such a structure, (a) the shaft 53, (b) the bush 54, (c) the handle 17, and (d) the plate spring 13 having the pressing block 20 are mutually assembled, forming the module 51.

In such a module 51, the shaft 53, which is assembled with both the plate spring 13 and the bush 54, can be separated from the handle 17. The shaft 53 is inserted from the bottom of the frame 11. Then, the upper bush portion 54*a* of the bush 54 is pressure-inserted into the bush hole 11*h* of the frame 11. The handle 17 is affixed by a screw 44 onto the shaft 53, which extrudes upward from the frame 11 in such a way that the module 51 can be mounted onto the frame 11. After the handle 17 is detached from the rotating inner shaft 53*a* of the shaft 53, the shaft 53 can be removed from the frame 11, so that the module 51 can be detached from the frame 11.

The frame 11 is designed in accordance with the specification of the aforementioned base 8, and because the module 51 is detachably installed to the frame 11, the kind of module 51 that corresponds to (a) the thickness and size of the circuit device 1, or (b) the number and load of conductive contact elements 4*b* of the contact probe 4, can be selected to use for a test. Therefore, it is possible to constitute a test socket 50 that can be used for a wide range of purposes.

(Fifth Embodiment)

FIGS. 24–28 show a test socket 60 in a fifth embodiment of the present invention.

Also in this embodiment, spring pieces 13b, which are formed on a plate spring 13, are flexed by movement of spheres 18 along with the rotation of the shaft 42, which constitutes one part of an operating member 12. As is similar to the third embodiment, an interval control system 31 is installed so as to control the interval between the frame 11 and the plate spring 13.

Figure 24:
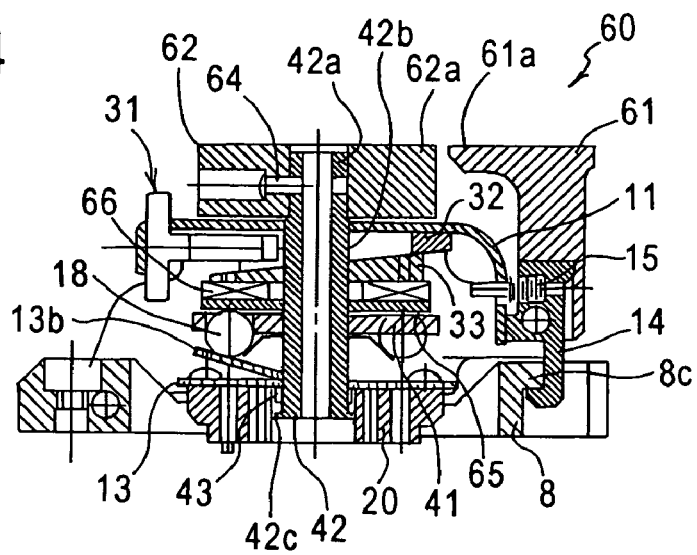
FIG. 24 is a vertical cross-sectional view illustrating a closed condition of the frame of a fifth embodiment of the present invention.

As is similar to the third embodiment, a rotation plate 41 is mounted onto a shaft 42 that can rotate in both the forward and reverse directions. As shown in FIG. 24, a handle 62 for rotating the shaft 42 is affixed by fastening a screw 64 to the top end of the shaft 42, under the condition that the rotation of the handle 62 against the shaft 42 is restrained.

In this embodiment, the constitutions and functions of the frame 11, the shaft 42, the interval control system 31, the rotation plate 41, the spheres 18, the plate spring 13, and the compression spring 43 are similar to those of the third embodiment, and therefore they will not be described in detail here.

When the rotation plate 41 rotates along with the rotation of the shaft 42, the spring pieces 13b are flexed by the spheres 18, and the plate spring 13 flexibly presses a circuit device (not shown) against a contact probe (not shown) via a pressing block 20.

In this embodiment, the invention is characterized such that it comprises (1) a rotation plate 65 that is arranged between (a) spheres 18, whose top parts protrude to the upper surface of the rotation plate 41, and (b) a second control plate 33, and (2) a slide member 66, which is arranged between the rotation plate 65 and the second control plate 33, and such that the rotation plate 65 can freely rotate around the shaft 42 that is inserted into the rotation plate 65.

Figure 26:
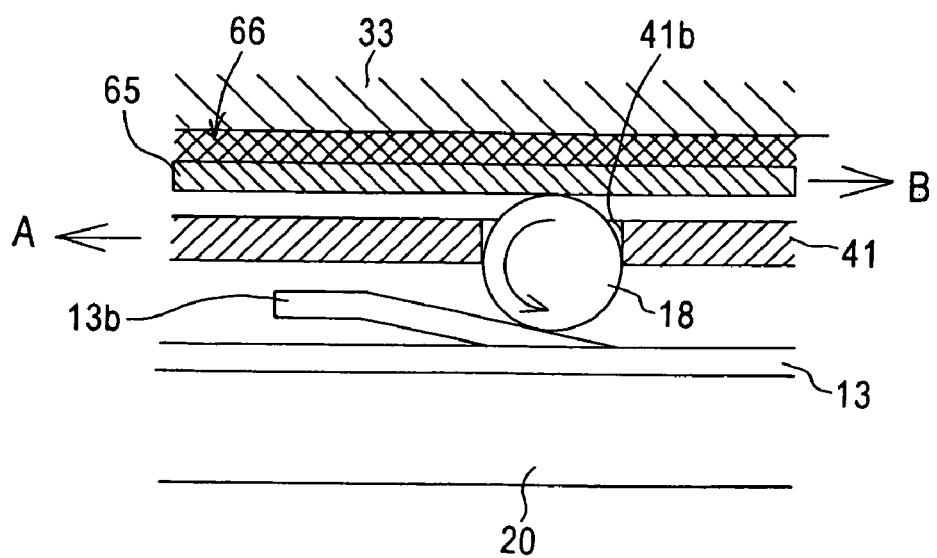
FIG. 26 is an enlarged vertical cross-sectional view of the main part of an engagement part of the operating part of the fifth embodiment.

FIG. 26 is an enlarged cross-sectional view of the main part of an operating/engaging part, including a sphere 18, in this embodiment.

If there is no rotation plate 65 or slide member 66, and if the operator grips the handle 62 so that the shaft 42 is rotated in the forward direction, namely Direction A in FIG. 26, the bottom surface of the nonrotating second control plate 33 is brought into contact with the top part of the spheres 18, and a frictional force that reduces the rotation of the spheres 18 arises on the contacting surface. As a result, the amount of force that is required to operate/rotate the handle 62 increases according to the amount of said frictional force.

However, in this embodiment, which includes the rotation plate 65 and the slide member 66, the rotation plate 65, which contacts with the top part of the spheres 18, rotates in Direction B, which is the reverse rotational direction of the shaft 42 and the rotation plate 41 by the reaction of frictional force due to the rotation of the spheres 18. Therefore, the top surface of the rotation plate 65 slides while contacting the bottom surface of the slide member 66. The slide member 66 is made of a friction-reducing material, such as a fluorocarbon resin washer, a dry bearing containing lubricant, or a thrust bearing, so that the friction at the time of sliding can be reduced. As a result, the amount of force that is required to operate the handle 62 can be reduced further.

Needless to say, as a variation, the interval control system 31 of this embodiment can be omitted. In such a case, the slide member 66 is directly arranged between the frame 11 and the rotation plate 65. Also, the rotation plate 41 can be a circular flange that is formed integrally with the shaft 42, as in the first or second embodiment. Furthermore, instead of the spheres 18, a roller can be used.

Figure 25:
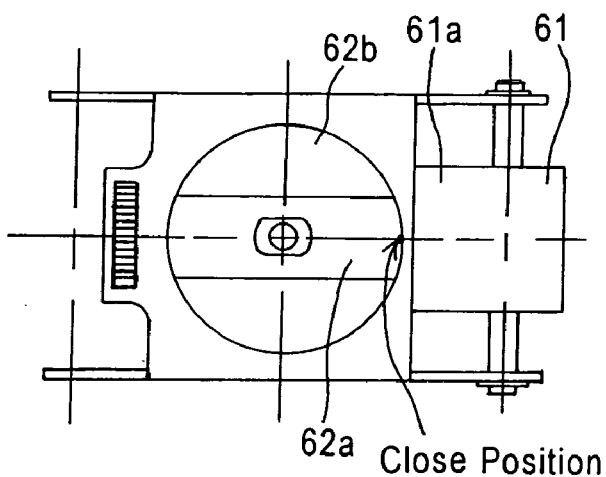
FIG. 25 is a horizontal plane view illustrating a closed condition of the frame of the fifth embodiment of the present invention.
Figure 27:
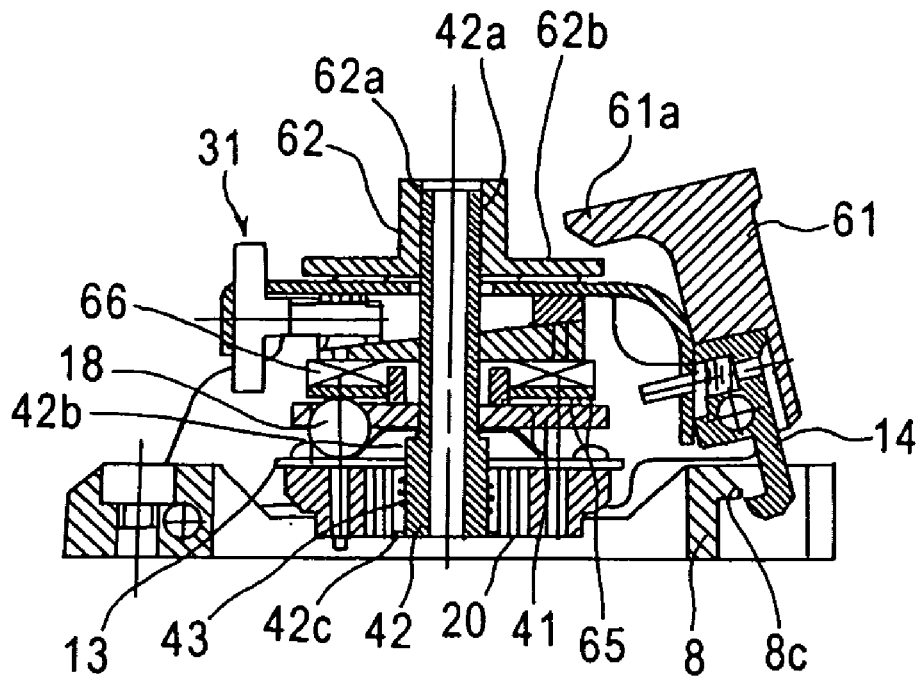
FIG. 27 is a vertical cross-sectional view illustrating an open condition of the frame of the fifth embodiment of the present invention.
Figure 28:
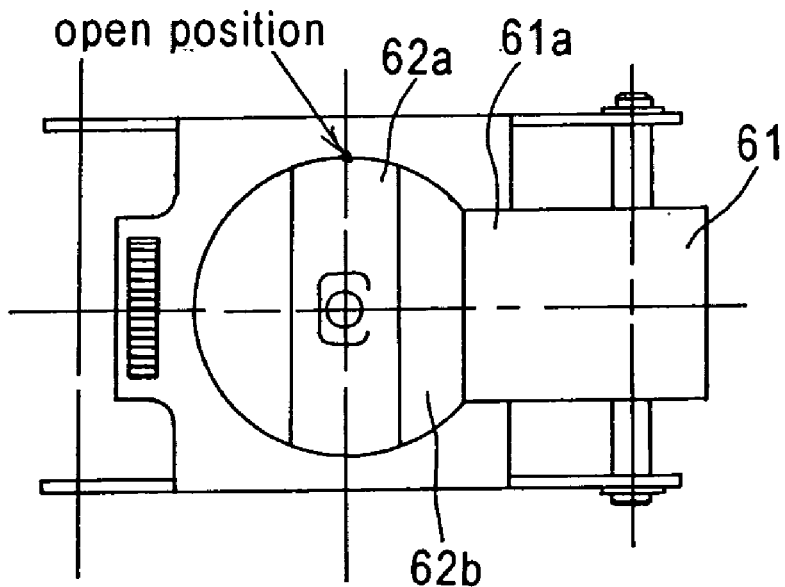
FIG. 28 is a horizontal plane view illustrating an open condition of the frame of the fifth embodiment of the present invention.

FIG. 24 is a vertical cross-sectional view showing a closed condition of the test socket 60 in this embodiment, FIG. 25 is a horizontal plane view, FIG. 27 is a vertical cross-sectional view showing an open condition of the socket, and FIG. 28 is a horizontal plane view.

In this embodiment, the constitutions of the fixing arm 11a of the frame 11, the hooking portion 8c of the base 8 for locking the test socket 60 in a closed condition, and a lock arm 14 to be engaged with the hooking portion 8c are similar to those of the second and third embodiments. However, a second characteristic of this embodiment is a structure such that, when the test socket 60 is closed, a protrusion 61a is formed so that it can interlock with the handle 62 in its fastened position on the top end of a lever 61 that is integrally formed with the lock arm 14.

As shown in FIGS. 24 and 25, in this embodiment, the handle 62 comprises (a) a relief portion 62b, wherein both ends of the upper part thereof are cut into a stepped shape, and both sides of its cylindrical center portion have been cut so as to the same shape, and (b) a grip portion 62a at the handle's center. To mount the handle 62 onto the shaft 42, the noncircular hole of the handle 62 and the end of the shaft 42 are engaged with each other under a condition of restrained rotation, and the handle 62 and the shaft 42 are fastened to each other by a fastening screw 64.

In this embodiment, as shown in FIGS. 24 and 25, when the test socket 60 is in a closed condition and the grip portion 62a of the handle 62 is rotated to its fastened position, the protrusion 61a of the lever 61 contacts and interlocks with the end face of the grip portion 62b of the handle 62 so that the lever 61 cannot release the fixed lock arm 14. Thus, under such a condition, the test socket 60 cannot be released, and it is impossible to remove an object to be tested, namely a circuit device. As a result, with such an embodiment it is possible to definitely prevent wrong actions, such as accidentally releasing the test socket 60 while the grip portion 62a of the handle 62 is at the fastened position.

As shown in FIGS. 27 and 28, when the test socket 60 is in an open position, and where the grip portion 62a of the handle 62 is rotated toward the direction of the open condition of the test socket 60, the protrusion 61a of the lever 61 is positioned at the upper part of the relief portion 62b of the handle 62 and does not interlock with the grip portion 62a of the handle 62, so that the lock arm 14 is maintained in an open condition. Accordingly, in this condition it is possible to release the test socket 60 and to remove an object to be tested, namely a circuit device.

Also, as a variation, the protrusion 61a in this embodiment can be formed so as to protrude to the side face of the handle 62 in such a manner as to interlock with the lever 61. That is to say, the lever 61 can be formed into an almost-vertical-face shape with the protrusion 61a having been cut and removed, and the vertical face can be constituted in such a manner as to interlock with the protrusion on the side of the handle 62. Then, as the handle 61 is rotated in the direction to release the test socket 60, said protrusion is separated from the vertical face of the lever 61, so that the interlock of said protrusion can easily be eliminated. In this case, the lock arm 14 and the lever 61 can be integrally formed.

(Other Embodiments)

Figure 29A:
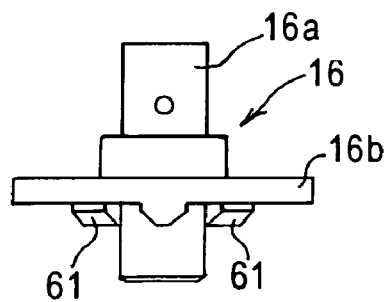
FIGS. 29(a) and (b) are a side view and a vertical cross-sectional view, respectively, illustrating a shaft in another embodiment.
Figure 29B:
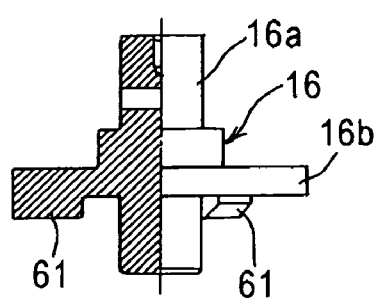
Figure 30:
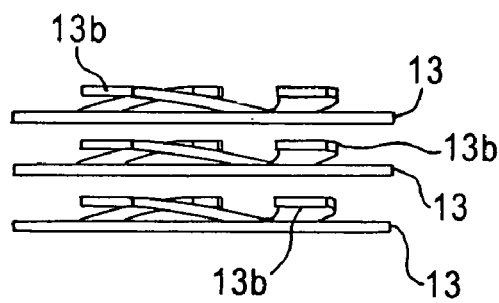
FIG. 30 is a side view illustrating a plate spring in another embodiment.

FIGS. 29–31 show other embodiments of the present invention. In the embodiment of FIG. 29, protrusions 61 that protrude toward a plate spring 13 are formed on a flange part 16b of a flange 16. The protrusions 61 are formed along the periphery of the flange part 16b at equal intervals and are brought into contact with spring pieces 13b that are formed so as to stand on the plate spring 13, while the protrusions and the spring pieces form sets. The protrusions 61 work to slide the spring pieces 13b as the shaft 16 is rotated in the forward or reverse direction. By this sliding, the spring pieces 13b are flexed, and a circuit device 1 can be pressed by the plate spring 13.

FIG. 30 shows an embodiment wherein plural plate springs 13 are stacked together. Because plural plate springs 13 are stacked, it is possible to increase the load for pressing a circuit device 1. As a result, the spring force can be large, and there is no need to use a plate spring of a large size or heavy weight, with the result that the spring can be arranged within a small space.

Figure 31A:
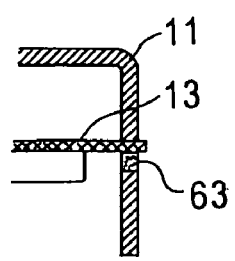
FIGS. 31(a) and (b) are vertical cross-sectional views illustrating a pressing/releasing member in another embodiment.
Figure 31B:
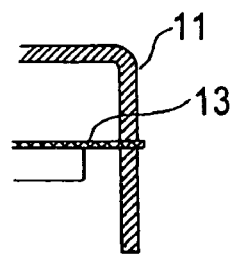

FIG. 31 shows another embodiment of a pressing/releasing member, which in this case applies pressure on the plate spring 13 so that the plate spring 13 can be separated from the circuit device 1. In FIG. 31(a), a compression spring 63 is mounted onto a frame 11, and the plate spring 13 is pressed so that the plate spring 13 can be separated from the circuit device 1 by the compression spring 63. Also, in FIG. 31(b), the end of the plate spring 13 is formed into a slit-like shape and is directly fastened to the frame 11, so as to perform pressing.

The present invention is not limited to the above-mentioned embodiments, and various changes and variations can be made. For example, a support shaft 9, which supports a frame 11 on a base 8 in a condition of free rotation, can be formed as a column. Also, the present invention can be used for various kinds of tests other than for pressing a circuit device 1 against a contact probe 4.

INDUSTRIAL APPLICABILITY

According to the invention of claim 1, because an object to be tested is pressed against the testing face of a testing device by the pressure of a pressing member, it is possible to press the object at a constant load and thereby to perform tests whose results will be reliable. Also, because the pressure of the pressing member is decreased by reverse rotation of the operating member, it is possible to remove the element smoothly and safely.

According to the invention of claim 2, because a plate spring presses or releases an object to be tested by forward or reverse rotations, respectively, within a predetermined angle of a shaft, operability is improved. In addition, the plate spring presses the object to be tested at a constant load, and thereby tests whose results will be reliable can be performed.

According to the invention of claim 3, because an object to be tested is pressed or released by forward or reverse rotations, respectively, within a predetermined angle of a shaft, operability is improved. In addition, a module comprising an operating member and a plate spring is detachably installed on the frame, so that a test socket can be used for a wide range of purposes.

According to the invention of claim 4, in addition to the effects of claims 2 and 3, because a plate spring does not accidentally press an object to be tested, it is possible to prevent wrong tests.

According to the invention of claim 5, in addition to the effects of claims 2–4 the interval between a plate spring and an object to be tested can be controlled, as a result of which it is possible to test various objects of different thicknesses and sizes, and to perform tests for a wide range of purposes.

According to the invention of claim 6, in addition to the effects of claims 2–5, because an object to be tested is pressed by the plate spring at a constant force, the object to be tested is pressed against the testing face uniformly, resulting in tests whose results will be reliable.

According to the invention of claim 7, in addition to the effects of claim 5, because the interval between a plate spring and an object to be tested is controlled by the movement of one control plate, it can be controlled simply and easily. Also, because the interval is controlled by an smoothly inclined face that is not stepped, it can be controlled precisely and evenly, not in steps or stages.

According to the invention of claim 8, in addition to the effects of claims 2 and 3, a frame can be simply attached to or detached from a base.

According to the invention of claim 9, in addition to the effects of claims 2–8, a rotation plate reduces the sliding resistance of spheres, and a slide member, which is made of a friction-reducing material, reduces the sliding resistance against the rotation plate, so that the force required to operate a rotation part is further reduced.

According to the invention of claim 10, in addition to the effects of claims 2–5, when the test socket is closed, mutual interference of protrusions that are installed on both the handle and the lever can definitely prevent wrong actions, such as accidentally releasing a test socket.

According to the invention of claim 11, in addition to the effects of claims 1–8, because a circuit device and a test board are electrically connected via a contact probe, the circuit device can be tested reliably.

What is claimed is:

1. A test socket for pressing an object to be tested to a testing face of a testing device, with said test socket comprising:
   a frame that is detachably mounted onto a base (which has an opening in which is placed the object to be tested, and which is mounted on said testing face), and that opens or closes said opening;
   an operating member that has a shaft that is mounted onto the frame so that said shaft can rotate both forward and backward within a predetermined angle, and on which engagement parts that move in synchronization with the rotation of said shaft while said engagement parts protrude towards the object to be tested; and
   one plate spring, or a plurality of plate springs that are overlaid on each other, which has/have spring pieces that are arranged at a specified angle in the direction in which said shaft rotates, and on which said engagement parts slide, and wherein:
   1) said frame rotates the operating member-under the condition that said opening is closed-so that the operating member rotates forward,
   2) said engagement parts slide on the spring pieces in the forward-rotational direction of said operating member due to said forward rotation of the operating member, and the spring pieces are flexed by this sliding, as a result of which the plate spring(s) is/are pressed againg said object to be tested.

2. A test socket as set forth in claim 1, wherein said test socket is provided with a pressing/releasing member that presses said plate spring in such a way that said plate spring moves away from the object to be tested.

3. A test socket as set forth in claim 1, wherein an interval control system, which controls the interval between a plate spring and said object to be tested, is installed between the aforementioned shaft and frame.

4. A test socket as set forth in claim 1, wherein plural pairs of said engagement parts and spring pieces are arranged at uniform intervals along the rotation direction of the aforementioned shaft.

5. A test socket as set forth in claim 3, wherein said interval control system has at least two control plates that are placed against each other in such a way that they can slide against each other, through which a shaft is inserted while said shaft's relative rotation against the frame is restrained, and that are arranged between said frame and said shaft; one of said control plates can move perpendicular to the shaft, and the surface of each of said control plates is inclined in the direction of its movement.

6. A test socket as set forth in claim 1, wherein a supporting shaft that is used to mount a frame is formed on the aforementioned base, there is formed on said frame an arm used for mounting said frame, with said arm such that it has an approximately U-shaped mounting groove (into which the support shaft can be inserted), and that the faces of both the support shaft and the fixing groove are parallel with each other.

7. A test socket as set forth in claim 1, wherein said test socket comprising a rotation plate that is arranged between said engagement parts and the frame or the interval control system, and that can freely rotate around the shaft when the shaft is inserted through it, and a slide member that is arranged between the rotation plate and the frame or the interval control system.

8. A test socket as set forth in claim 1 with said test socket further comprising a lock arm that is rotatably mounted onto said frame, and maintains a condition such that said frame can close the opening of the aforementioned base, and protrusions that interlock with when said frame is closed, and are formed on a handle that is affixed to the top end of said shaft.

9. A test socket for pressing an object to be tested to a testing face of a testing device, with said test socket comprising:

a frame that is detachably mounted onto a base (which has an opening in which is placed the object to be tested, and which is mounted on said testing face), and that opens or closes said opening;

an operating member that has a shaft that is mounted onto the frame so that said shaft can rotate both forward and backward within a predetermined angle, and on which engagement parts that move in synchronization with the rotation of said shaft while said engagement parts protrude towards the object to be tested; and one plate spring, or a plurality of plate springs that are overlaid on each other, which has/have spring pieces that are arranged at a specified angle in the direction in which said shaft rotates, and on which said engagement parts slide, and wherein:

1) said frame rotates the operating member-under the condition that said opening is closed-so that the operating member rotates forward, 2) said engagement parts slide on the spring pieces in the forward-rotational direction of said operating member due to said forward rotation of the operating member, and the spring pieces are flexed by this sliding, as a result of which the plate spring(s) is/are pressed againg said object to be tested, wherein the object to be tested is a circuit device onto which patterns are formed, and the testing device comprises a test board onto which an electrode part is formed, and wherein a contact probe that is pressed by a coil spring that is mounted onto said test board in such a way that plural conductive contact elements, whose two axial ends are needle- like, and match said electrode part can be accommodated in line in a housing, and such that the axial ends of said conductive contact elements can protrude outside the housing.

* * * * *